US012651105B2

(12) United States Patent
Dhand et al.

(10) Patent No.: US 12,651,105 B2
(45) Date of Patent: Jun. 9, 2026

(54) FAST QUANTUM CIRCUIT SIMULATIONS WITH PARALLEL TASK-BASED TENSOR NETWORK CONTRACTION

(71) Applicant: Xanadu Quantum Technologies Inc., Toronto (CA)

(72) Inventors: Ish Dhand, Ulm (DE); Trevor Vincent, Toronto (CA); Haoyu Qi, Toronto (CA)

(73) Assignee: Xanadu Quantum Technologies Holdings ULC, Toronto (CA)

( * ) Notice: Subject to any disclaimer, the term of this patent is extended or adjusted under 35 U.S.C. 154(b) by 1045 days.

(21) Appl. No.: 17/828,597

(22) Filed: May 31, 2022

(65) Prior Publication Data

US 2022/0391571 A1 Dec. 8, 2022

Related U.S. Application Data

(60) Provisional application No. 63/195,908, filed on Jun. 2, 2021.

(51) Int. Cl.
G06F 30/3308 (2020.01)
G06N 10/20 (2022.01)

(52) U.S. Cl.
CPC ......... G06F 30/3308 (2020.01); G06N 10/20 (2022.01)

(58) Field of Classification Search
CPC ..... G06F 30/3308; G06N 10/20; G06N 10/80
See application file for complete search history.

(56) References Cited

U.S. PATENT DOCUMENTS

| | | | |
|---|---|---|---|
| 12,242,924 B2 * | 3/2025 | Ruedinger | G06N 10/40 |
| 2024/0054379 A1 * | 2/2024 | Hodson | G06N 10/60 |

FOREIGN PATENT DOCUMENTS

| | | | | |
|---|---|---|---|---|
| CA | 3100326 A1 * | 11/2019 | | H04J 14/0279 |
| WO | WO-2021045976 A1 * | 3/2021 | | G06N 3/045 |

OTHER PUBLICATIONS

Fang, "A Parallel Tensor Network Contraction Algorithm and Its Applications in Quantum Computation", 2020, University of Michigan, pp. 1-126 (Year: 2020).*

Schutski et al, "Simple Heuristics for Efficient Parallel Tensor Contraction and Quantum Circuit Simulation", Dec. 28, 2020, Huawei Technologies, Central Research Institute, American Physical Society, pp. 062614-1 to 062614-11 (Year: 2020).*

(Continued)

*Primary Examiner* — Rehana Perveen
(74) *Attorney, Agent, or Firm* — Cooley LLP

(57) ABSTRACT

A method includes receiving a representation of a quantum circuit at a processor and identifying multiple contraction trees based on the representation of the quantum circuit. Each of the contraction trees represents a tensor network from a set of tensor networks. A first subset of multiple tasks, from a set of tasks associated with the plurality of contraction trees, is assigned to a first set of at least one compute device having a first type. A second subset of multiple tasks mutually exclusive of the first subset of multiple tasks is assigned to a second set of at least one compute device having a second type different from the first type. The quantum circuit is simulated by executing the first subset of tasks via the first set of at least one compute device and executing the second subset of tasks via the second set of at least one compute device.

29 Claims, 17 Drawing Sheets

(56) References Cited

OTHER PUBLICATIONS

Standley, "Which Tasks Should Be Learned Together in Multitask Learning?", 2020, 37th International Conference on Machine Learning, Online, PMLR 119, pp. 1-13. (Year: 2020).*
Office Action for Canadian Patent Application No. CA3161314 dated Feb. 28, 2024, 5 pages.
Huang, et al., "Cpp-Taskflow: Fast task-based parallel programming using modern C++." In 2019 IEEE International Parallel and Distributed Processing Symposium (IPDPS), May 20, 2019, pp. 974-983.

* cited by examiner

1300

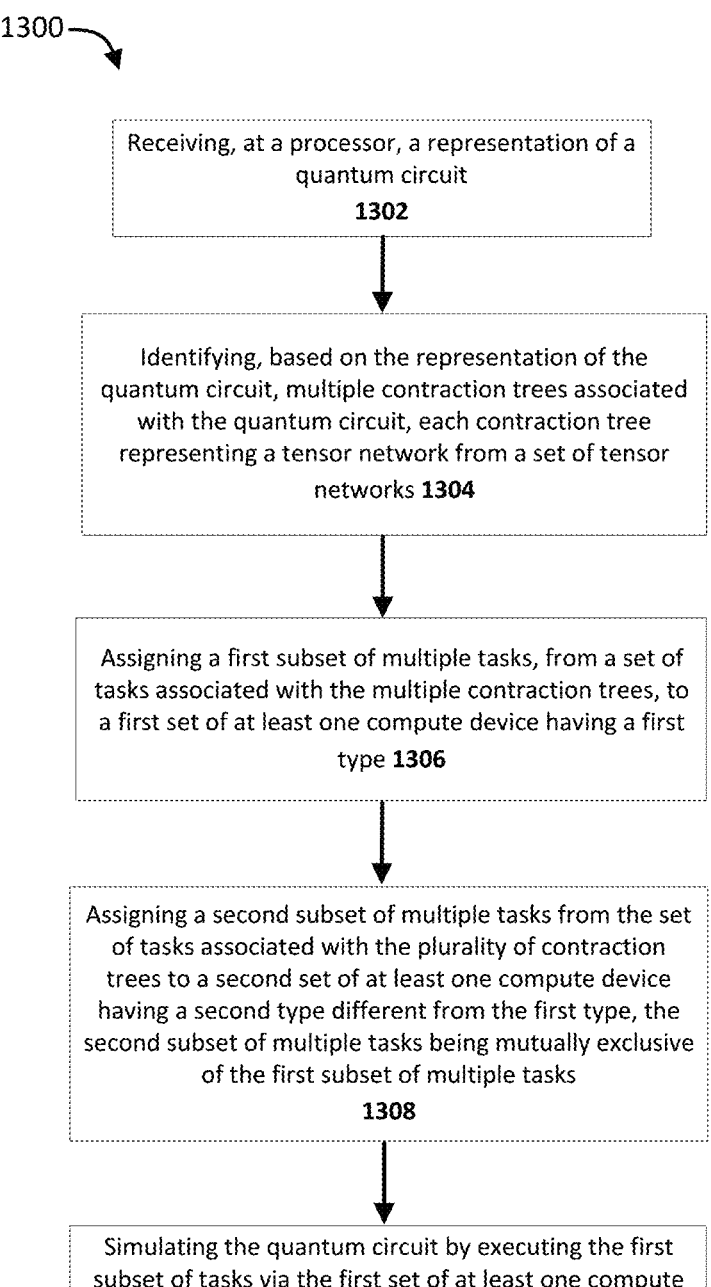

Receiving, at a processor, a representation of a quantum circuit
1302

Identifying, based on the representation of the quantum circuit, multiple contraction trees associated with the quantum circuit, each contraction tree representing a tensor network from a set of tensor networks 1304

Assigning a first subset of multiple tasks, from a set of tasks associated with the multiple contraction trees, to a first set of at least one compute device having a first type 1306

Assigning a second subset of multiple tasks from the set of tasks associated with the plurality of contraction trees to a second set of at least one compute device having a second type different from the first type, the second subset of multiple tasks being mutually exclusive of the first subset of multiple tasks
1308

Simulating the quantum circuit by executing the first subset of tasks via the first set of at least one compute device and executing the second subset of tasks via the second set of at least one compute device
1310

Figure 14:
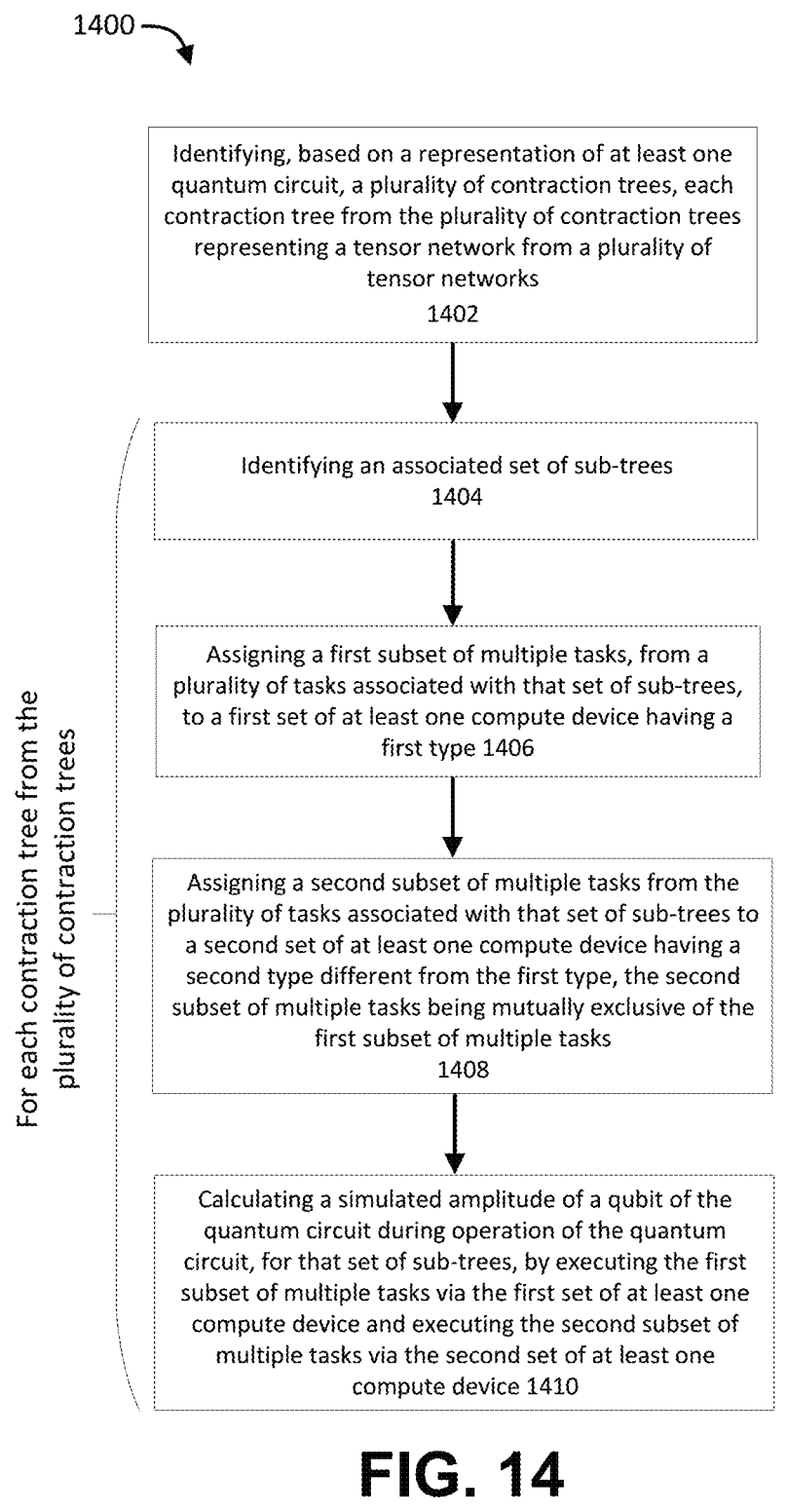

Identifying, based on a representation of at least one quantum circuit, a plurality of contraction trees, each contraction tree from the plurality of contraction trees representing a tensor network from a plurality of tensor networks
1402

↓

Identifying an associated set of sub-trees
1404

↓

Assigning a first subset of multiple tasks, from a plurality of tasks associated with that set of sub-trees, to a first set of at least one compute device having a first type 1406

↓

Assigning a second subset of multiple tasks from the plurality of tasks associated with that set of sub-trees to a second set of at least one compute device having a second type different from the first type, the second subset of multiple tasks being mutually exclusive of the first subset of multiple tasks
1408

↓

Calculating a simulated amplitude of a qubit of the quantum circuit during operation of the quantum circuit, for that set of sub-trees, by executing the first subset of multiple tasks via the first set of at least one compute device and executing the second subset of multiple tasks via the second set of at least one compute device 1410

For each contraction tree from the plurality of contraction trees

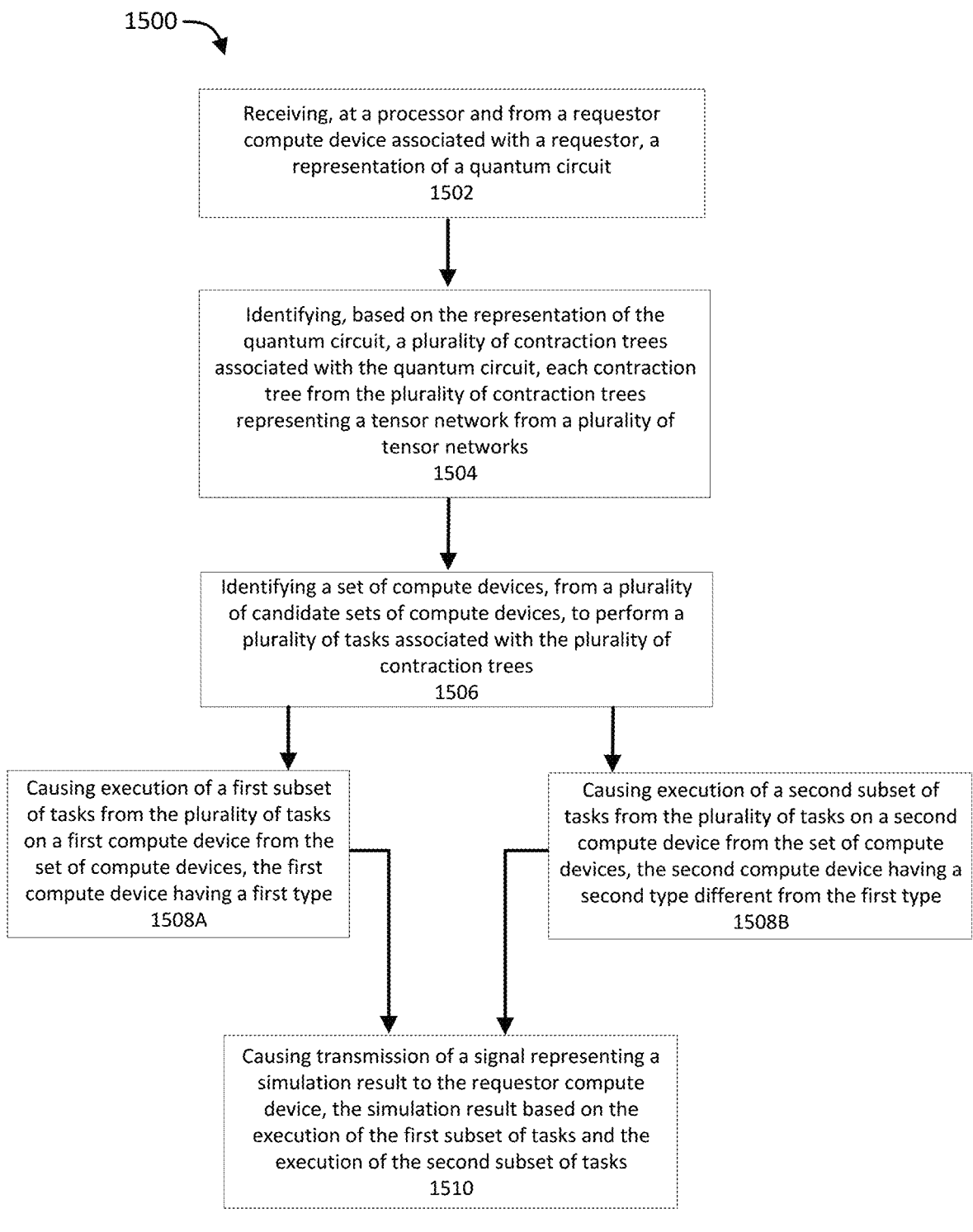

Receiving, at a processor and from a requestor compute device associated with a requestor, a representation of a quantum circuit
1502

Identifying, based on the representation of the quantum circuit, a plurality of contraction trees associated with the quantum circuit, each contraction tree from the plurality of contraction trees representing a tensor network from a plurality of tensor networks
1504

Identifying a set of compute devices, from a plurality of candidate sets of compute devices, to perform a plurality of tasks associated with the plurality of contraction trees
1506

Causing execution of a first subset of tasks from the plurality of tasks on a first compute device from the set of compute devices, the first compute device having a first type
1508A Causing execution of a second subset of tasks from the plurality of tasks on a second compute device from the set of compute devices, the second compute device having a second type different from the first type
1508B Causing transmission of a signal representing a simulation result to the requestor compute device, the simulation result based on the execution of the first subset of tasks and the execution of the second subset of tasks
1510

FIG. 15

FAST QUANTUM CIRCUIT SIMULATIONS WITH PARALLEL TASK-BASED TENSOR NETWORK CONTRACTION

CROSS-REFERENCE TO RELATED PATENT APPLICATIONS

This application claims the benefit of, and priority to, U.S. Provisional Application No. 63/195,908, filed Jun. 2, 2021 and titled "Fast Quantum Circuit Simulations with Parallel Task-Based Tensor Network Contraction," the entire content of which is incorporated herein by reference for all purposes.

FIELD

The present disclosure is related to quantum computing, and more specifically, to the simulation of quantum circuits.

BACKGROUND

Classical simulation of quantum systems is the workhorse of research in quantum many-body physics and quantum information processing. In particular, a large amount of research has gone into classical simulations of random quantum circuits (RQCs), as they are good candidates for demonstrating quantum advantage. Indeed, in a landmark paper, Arute et al. demonstrated quantum advantage using their Sycamore-53 device on a 53-qubit RQC with a depth of 20 cycles. It has since been observed, however, that such classical simulations produce overestimates and could be improved upon, for example, by using secondary storage of the Summit supercomputer.

SUMMARY

In some embodiments, a method includes receiving a representation of a quantum circuit at a processor and identifying multiple contraction trees based on the representation of the quantum circuit. Each of the contraction trees represents a tensor network from a set of tensor networks. A first subset of multiple tasks, from a set of tasks associated with the plurality of contraction trees, is assigned to a first set of at least one compute device having a first type. A second subset of multiple tasks mutually exclusive of the first subset of multiple tasks is assigned to a second set of at least one compute device having a second type different from the first type. The quantum circuit is simulated by executing the first subset of tasks via the first set of at least one compute device and executing the second subset of tasks via the second set of at least one compute device.

BRIEF DESCRIPTION OF THE DRAWINGS

The drawings primarily are for illustration purposes and are not intended to limit the scope of the subject matter described herein. The drawings are not necessarily to scale; in some instances, various aspects of the disclosed subject matter disclosed herein may be shown exaggerated or enlarged in the drawings to facilitate an understanding of different features. In the drawings, like reference characters generally refer to like features (e.g., functionally similar and/or structurally similar elements).

FIGS. 13-15 are flowcharts showing methods for simulating quantum circuits, according to some embodiments.

DETAILED DESCRIPTION

Figure 1:
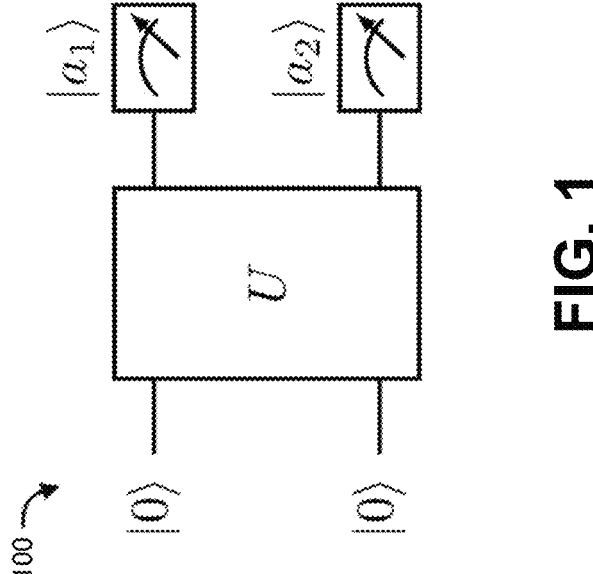
FIG. 1 is a pictorial representation of a general two-qudit quantum circuit.

Embodiments set forth herein include software-implemented methods for performing task-based parallelism to obtain large increases in speed and efficiency in classical tensor-network simulations of quantum circuits and many-body quantum systems. These increases in speed and efficiency can result, at least in part, due to one or more of: (1) the increased parallelism introduced by mapping the tensor-network simulation to a task-based framework, (2) novel methods of reusing shared work between tensor-network contraction tasks, and (3) the concurrent contraction of tensor networks on both CPUs and GPUs. According to some embodiments set forth herein, nearly an order of magnitude speedup can be achieved over other simulators for Sycamore-53 and three-dimensional (3D) Gaussian boson sampling (GB S) supremacy circuits. Theoretical performance estimates are also provided herein and compared for tensor-network simulations of Sycamore-53 and GBS supremacy circuits for the first time. Slice-finding methods, referred to herein as "task-based slicing," which are superior to known methods of slicing for tensor network simulators, are also presented herein, as are batch-amplitude computation methods, referred to herein as "task-based batching," which can facilitate unprecedented speedups in quantum circuit simulations such as those used in the benchmarking of quantum advantage, where batches of amplitudes are typically desired. The simulation software used to implement one or more embodiments of the present disclosure is referred to herein as "Jet."

Some proposed supremacy experiments, such as those using GBS and a three-dimensional random quantum circuit (RQC), are projected to be much more difficult to simulate classically than Sycamore-53, with some simulations showing it would take ≈1014 seconds on the top supercomputer in the most idealized scenario (i.e., where unlimited memory was available). While there are many different classical methods for simulating RQCs, the fastest known methods involve tensor networks. Despite the levels of complexity and recent innovations to the algorithms of such classical simulations, they are still orders of magnitude slower than the Sycamore-53 device. A major issue in known simulations has been efficiency, which in some instances has been only around 15 percent of the theoretical compute performance of the NVIDIA® V100 GPU on which the tests have been performed. Another issue with known simulations has been the lack of CPU usage in the simulations, resulting in underutilization of the Summit supercomputer, which has 9,216 IBM POWER9 22-core CPUs amongst the 27,648 NVIDIA® Tesla V100 GPUs.

With the oncoming era of exascale computing, supercomputer nodes are expected to increase in parallelism and heterogeneity, with billions of threads running concurrently. More specifically, the systems are not expected to increase in their numbers of nodes, but rather in on-node concurrency with large multi-core CPUs and multiple GPUs per node. Memory subsystems are expected to increase in size and bandwidth, and decrease in latency, however the memory size and memory bandwidth per core are expected to decrease. Due to the large number of components in an exascale machine, hardware failures are expected to increase, and fault tolerance may become a significant issue. Known programming models may have difficulty addressing these changes, for example because known approaches make heavy use of synchronization. At the intra-node level, threads are subject to the fork-join model, and similar synchronization points exist in known inter-node approaches that use the common bulk synchronous parallel model. Performance variability in hardware can mean that uniformly dividing up work between processing units would lead to load imbalance, causing the entire computation to run at the speed of the slowest processing unit. Moreover, some known RQC simulation techniques have low central processing unit (CPU) usage and efficiency, as well as significant redundancy when calculating a single amplitude. Additional redundancies can occur, in some known RQC simulation techniques, when calculating multiple related amplitudes, which is a known challenge in quantum computing.

To address the foregoing issues with known programming models, one or more embodiments of the present disclosure use asynchronous task-parallelism (also referred to as asynchronous many-task run-time models). Asynchronous task-parallelism includes decomposing an algorithm into units of work ("tasks") and executing them asynchronously. Asynchronicity facilitates the hiding of communication latencies, whilst dependencies between tasks enforce program correctness and allows for finer-grained synchronization. Furthermore, to solve the problem of heterogeneity, tasking can facilitate load balance by executing work when needed (and not executing work when not needed), in contrast to known methods of problem subdivision. In addition to solving problems that will exist in upcoming exascale supercomputers, task-based parallelism will allow for more irregular and complex scientific programs to be solved, which have previously been untenable due to a lack of support for a suitable programming model. Asynchronous task-parallelism and task-parallelism libraries can also be used to effectively handle fault tolerance issues without global synchronization. Task-parallelism libraries under active development include Taskflow, Charm++, HPX, and Kokkos. To the inventors' knowledge, there have been no prior publications detailing how to map tensor network quantum circuit simulations to a task-parallelism framework. Methods set forth herein, in accordance with some embodiments, include the construction of one or more task dependency graphs for a tensor-network based quantum-circuit simulation to be executed efficiently on heterogeneous (e.g., hybrid CPU-GPU) nodes using one or more task-based libraries (e.g., the Cpp-Taskflow library, discussed further below). The use of task-parallelism provides at least three key advantages over known quantum simulators. First, decomposing a problem into multiple tasks allows for a greater degree of parallelism because multiple tensor transposes and/or contractions can be executed concurrently. Second, by precomputing the complete task-graph, rather than constructing it "on-the-fly," shared computation among multiple tensor-network contractions can be leveraged without any extra effort (i.e., computational complexity). Third, one or more task-based libraries can be used to target heterogeneous CPU-GPU (e.g., CPU+multi-GPU) nodes. Embodiments set forth herein are not limited to contracting on one node. Rather, in some embodiments, by using a combination of a Message-Passing-Interface library (MPI), Cpp-Taskflow (hereinafter "Taskflow"), and a straightforward parallel computation technique called slicing, it is possible to scale to very large clusters.

Tensor Networks

A tensor network is a countable set of tensors bonded together by contracted indices. A reduction of the tensor network, achieved through the summation of all contracted indices, can be referred to as a "contraction" of the tensor network. Contracting tensor networks with arbitrary structure remains at least #P-hard, using known approaches. The complexity class #P is the set of counting problems associated with the decision problems in the set NP (non-deterministic polynomial-time). The time complexity of a contraction can be heavily sensitive to the order of summations (i.e., the order in which the index sums are evaluated), with the determination of the optimal path (i.e., the operation-minimizing contraction sequence for a single tensor network, or a single term in quantum chemistry) being an NP-hard (non-deterministic polynomial-time hardness) problem. Despite these difficulties, several approximate and exact known methods have been developed to quickly determine quasi-optimal contractions paths and contract the tensor network, with the most common methods being tree decomposition and graph partitioning.

Quantum Circuits as Tensor Networks

A quantum circuit is a series of logical gates acting on qudits, a d-level generalization of qubits. In general, a quantum circuit can be represented as a unitary operator U acting on an input set of qudits, each qudit being in an initial state $|0\rangle$. A graphical representation of a general two-qudit quantum circuit is provided in FIG. 1.

For benchmarking classical simulations of random quantum circuits, a set of qudits may be generated, in a random state $|a_1 a_2\rangle$, referred to herein to as a final state. An amplitude is then calculated, defined by:

$$\langle a_1 a_2 | U | 00 \rangle .$$

The amplitude defined above can be computed through the contraction of a tensor network representing the quantum circuit(s). The time complexity of this contraction provides an indication of how difficult it is to simulate this circuit.

As used herein, "amplitude" refers to the description of a quantum state, in a particular measurement basis. The amplitude is a complex number, which when squared, represents the probability that a given qubit will be either state [0> or state [1>. The imaginary parts of the amplitude contain phase information. For example, a qubit can be written as alpha[0>+beta[1>, where alpha and beta are complex numbers, and [0> and [1> are the down and up states possible for the qubit. Some embodiments set forth herein include simulations of quantum circuits, in which the probabilities of a particular measurement outcome at the end of the quantum circuit are calculated. The probabilities can be vectors of real numbers, with lengths n=number of qubits. To calculate such probabilities, complex numbers are tracked throughout the simulation of the quantum circuit. Amplitudes can be calculated both before and after the simulation of the application of quantum gates. The "quantum circuit" describes the entire chain of initial state, application of gate sequence, and measurement of result. Each gate is a finite step in the process, generally leading to another branch in the tree. Depending on how many gates are involved (referred to herein as "circuit depth"), the number of amplitude calculations can increase in a complicated, gate-dependent way. For example, the number of amplitude calculations can increase exponentially in the number of qubits or width of the circuit. That exponential increase is a challenge addressed by one or more embodiments described herein.

Example Circuit

Figure 2:
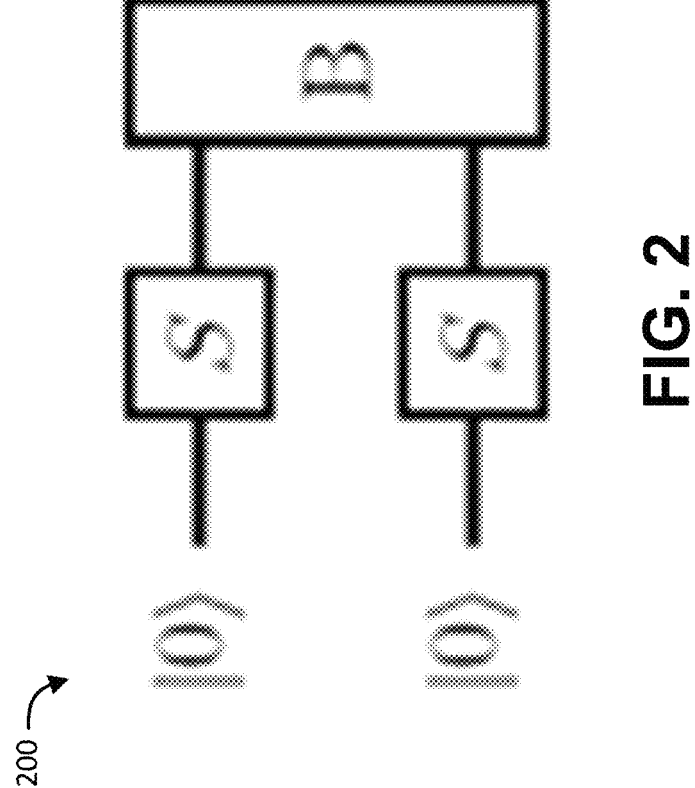
FIG. 2 is a pictorial representation of an example two-qudit circuit, including two one-qudit gates followed by a two-qudit gate.

Consider the two-qudit circuit shown in FIG. 2. In the circuit of FIG. 2, two one-qudit gates "S" are followed by a two-qudit gate B. Each of the one-qudit S gates can be represented by an associated tensor of rank 2, $S_{ba}$, whereas B is a two-qudit gate represented by a tensor of rank 4, $B_{cfbe}$. The initial and/or final states can be the products of rank-one tensors: $|0\rangle_a |0\rangle_d$. All tensors in this example have indices with dimension D, the size of the qudit. A tensor network representation of this circuit is formed by connecting these tensors, which represent the nodes of the network, together by the indices they share, which represent the edges of the network. For example, $S_{ba}$ is connected to $|0\rangle_a$ and $B_{cfbe}$ along the shared indices b and a.

For classical simulations of large random quantum circuits, it may not be possible to store the final state in memory to sample from. As such, in some cases, only amplitudes or other low-memory quantities are computed. If the amplitude of the quantum state $|a_1 a_2\rangle$ is desired, the rank-1$|a_1\rangle_c$ and $|a_2\rangle_f$ tensors are attached to the $B_{cfbe}$ tensor.

The amplitude $\langle a_1 a_2 | \mathcal{U} | 00 \rangle$, which will be shortened to $\langle a | \mathcal{U} | 0 \rangle$ hereafter, can then be computed through the contraction of a tensor network. One way of computing such a contraction is by summing over all indices in the network:

$$\langle a|U|0\rangle = \sum_{abcdef}^{D} \langle a_1|_c \langle a_2|_f B_{cfbe} S_{ba} S_{ed} |0\rangle_a |0\rangle_d. \quad (1)$$

Pairwise Contraction

Computing the amplitude by calculating the sum in Eqn. 1 has a time complexity of $\mathcal{O}(D^6)$ and, in general, has an exponential cost in the number of shared indices. It has been shown that pairwise contraction of the tensors in a tensor network is orders of magnitude faster than naive summation at computing a tensor network contraction. For the tensor network defined by Eqn. 1, one could follow the sequence of pairwise contractions to obtain the same resulting amplitude:

$$1) \sum_c \langle a_1|_c B_{cfbe} = T^1_{fbe} \quad O(D^4) \quad (2)$$

$$2) \sum_d S_{ed} |0\rangle_d = T^2_e \quad O(D^2)$$

$$3) \sum_a S_{ba} |0\rangle_a = T^3_b \quad O(D^2)$$

$$4) \sum_f \langle a_2|_f T^1_{fbe} = T^4_{be} \quad O(D^3)$$

$$5) \sum_e T^4_{be} T^2_e = T^5_b \quad O(D^2)$$

$$6) \sum_b T^3_b T^5_b = \langle a|U|0\rangle \quad O(D)$$

Figure 3:
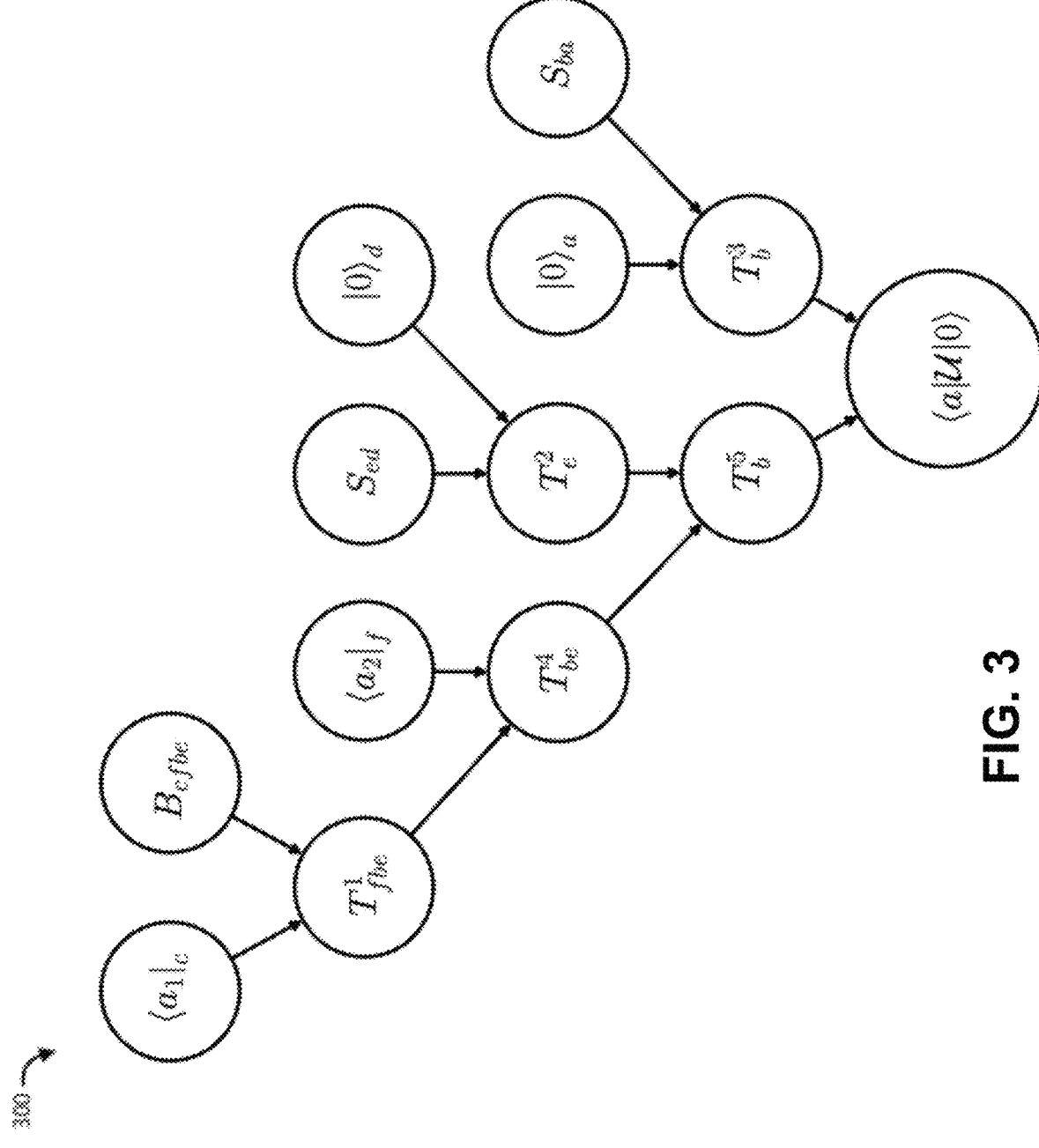
FIG. 3 is a diagram of a binary contraction tree for pairwise contraction, according to some embodiments.
Figure 4:
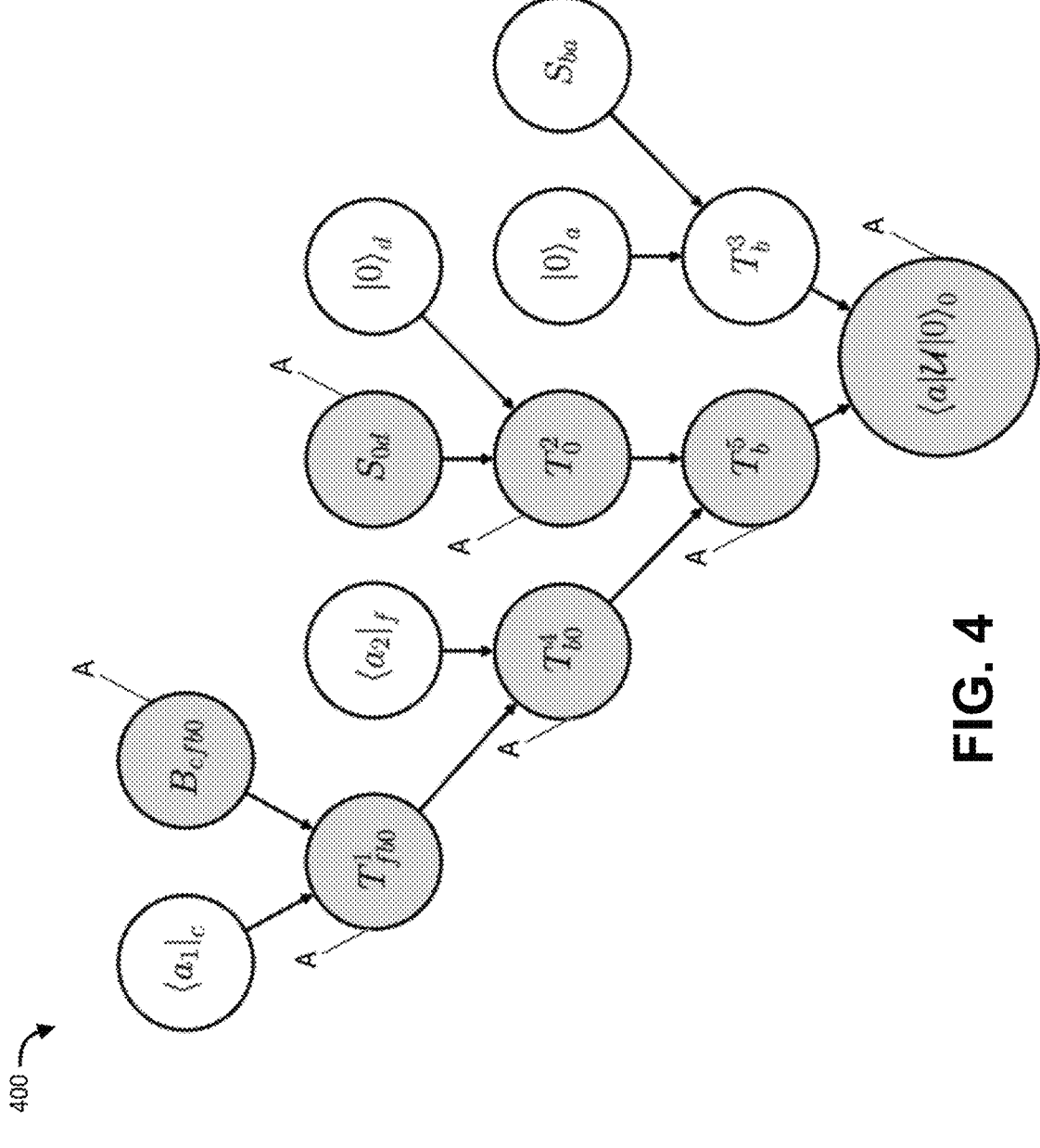
FIG. 4 is a diagram of a binary contraction tree for a slice of FIG. 3 through the index e with value 0, according to some embodiments.

The pairwise contraction in equations (2) can be described using a binary tree, as shown in FIG. 3. Changing the contraction path will also change the binary tree associated with it. FIG. 4 shows a binary contraction tree for a slice of FIG. 3 through the index e with value 0. Grey nodes (labelled "A") denote nodes that are sliced or that are the result of a contraction involving a sliced tensor Slicing As quantum circuits increase in depth and in the number of qudits, the intermediary tensors in the contraction tree grow in memory. To avoid the need to hold the tensors in distributed memory, which could involve inter-node communication to compute contractions, tensor-networks can use a method known as slicing or cutting. Slicing includes subdividing a tensor network by fixing the value of a shared index. A user may select one or more indices to fix, and in which order to fix them over time, to construct a variety of different trees and paths. For example, considering the qudit circuit example of FIG. 2, with the contraction defined by Eqn. 1 and D=2, each tensor index can have a value of 0 or 1. If index e is sliced in the tensor network, then Eqn. 1 reduces to two partial sums ($s_0$ and $s_1$), as follows:

$$1) \sum_{acdfb} \langle a_1|_c \langle a_2|_f B_{cfb0} S_{ba} S_{0d} |0\rangle_a |0\rangle_d = s_0 \quad (3)$$

$$2) \sum_{acdf} \langle a_1|_c \langle a_2|_f B_{cfb1} S_{ba} S_{1d} |0\rangle_a |0\rangle_d = s_1 \quad (4)$$

$$3) \sum_i s_i = \langle a|U|0\rangle \quad (5)$$

Slicing the tensor network in this manner allows for straightforward parallel computation, in that the two partial sums can be distributed to two different processing units for computation, and the results can be collected via a single reduction operation after the two partial sums are computed. Equivalently, in terms of pairwise contraction, slicing the index e results in two different binary contraction trees, which can be distributed to two different processing units. As an example of a sliced contraction tree, one of the two possible slices through the e index with a value of e=0 is shown in FIG. 4. The total FLOP (number of Floating-Point Operations) for a sliced computation of an amplitude is:

$$FLOP_{AMP} = N_{SL} FLOP_{SL}, \quad (6)$$

where $N_{SL}$ is the number of slices and $FLOP_{SL}$ is the FLOP of a contraction of a single slice. A goal of previous tensor-network contraction algorithms was to find a set of slices and a contraction path that minimizes Eq. 6.

For a fixed contraction order, slicing will typically increase the total FLOP as compared to the non-sliced contraction order, known as the slicing overhead. By optimizing the contraction order after slicing the network, however, one can minimize or eliminate the increase in total FLOP.

Task-Based Parallelism and Taskflow

As high-performance computing (HPC) moves toward increasingly diverse architectures and larger processor counts in the exascale era, new programming models are being developed to mitigate the predicted challenges. The current trend of the high-performance community is a move towards asynchronous task-parallelism, also referred to as asynchronous many-task parallelism. Asynchronous task-parallelism is based on the notion of a "task," which represents an asynchronous operation. The size or granularity of a task can range from a single hardware instruction to many hardware instructions. Tasks can be strung together based on dependencies to form a task graph. At run-time, a scheduler may continuously feed processing units with tasks from the task graph until the computation has completed. Task-parallelism has demonstrated great performance for a variety of complex scientific applications.

A variety of libraries, application programming interfaces (APIs), and language extensions exist that implement some form of asynchronous task-parallelism. In some embodiments, the C++ library Taskflow is selected/used, due to its ease of use, modern design, and improved performance over other competing libraries. Unlike many other libraries, Taskflow supports general control flow, as opposed to merely a simple directed acyclic task graph, as well as a work-stealing task scheduler that can efficiently utilize heterogeneous architectures such as a multi-core CPU connected to multiple GPUs, as can be used amongst supercomputer nodes. In addition, Taskflow can handle multiple GPU vendors through the SYCL® programming model portability layer. Although Taskflow primarily supports on-node parallelism, an MPI+Taskflow model can be used on distributed memory clusters when the problem is "embarrassingly parallel" as a result of the slicing described herein. As used herein, an embarrassingly parallel workload or problem is a workload or problem that can be separated into a set of parallel tasks with minimal or no computational effort.

Overview of Tensor-Network Simulators for Quantum Circuit Simulation

Many high-performance tensor-network simulators have been developed for various types of quantum simulation. Some such simulators benchmark amplitude and/or sample calculations of massive quantum circuits, such as Sycamore-53 or GBS circuits. Other such simulators are specifically developed for exascale computing. To date, there have been three major publications for tensor-network simulators benchmarking the Sycamore-53 circuit. The first of these publications was by Google® using the tensor-network simulator qFlex for CPU simulations and TAL-SH for GPU simulations. These simulations used a contraction order and set of slices predetermined by human calculation, and no algorithms were used to optimize these slices or paths. The qFlex simulator had one of the fastest available CPU tensor contraction engines (specialized for tensor networks) available at the time, and likewise TAL-SH was one of the fastest available for GPU tensor contraction. In Arute et al., the authors were unable to simulate the Sycamore-53 circuit to m=20 cycles with qFlex/TAL-SH or to provide estimates because the intermediary tensors along the contraction path could not fit on a node. Instead, Arute computed 1 million samples to 0.5% fidelity in $4.644 \times 10^3$ seconds for the m=12 circuit, and estimated that one million samples could be computed to 0.5% fidelity in $5.875 \times 10^6$ seconds for the m=14 circuit. This simulation was run on 4,550 nodes out of 4,608 nodes of the Summit supercomputer (at the time the largest supercomputer) with 6 GPUs per node.

The second publication came the following year, with Gray and Kourtis showcasing the strength of hypergraph partitioning methods in finding optimal contraction paths. Together with a greedy slicing algorithm, Gray et al. dramatically reduced the runtimes for various Sycamore-53 circuits using their software library called CoTenGra. On a single NVIDIA® Quadro P2000, the authors were able to contract an amplitude for the Sycamore-53 m=12 circuit in $5.74 \times 10^2$ seconds, the m=14 circuit in an estimated $2.92 \times 10^3$ seconds, and the m=20 circuit in an estimated $7.17 \times 10^9$ seconds. This was the first estimate for the time complexity of the m=20 circuit.

The third publication came in late 2020 with Huang et al. fine-tuning the method of Gray et al. using dynamic slicing and local optimization. Huang et al. started with a contraction order found using hypergraph partitioning, and then alternated between finding a slice (using a greedy algorithm) and local optimization of the sliced contraction tree by doing exact solves of several sub-trees. Using this method in an AC-QDP simulator, Huang et al. ran one sample of the m=12 and m=14 circuits on a NVIDIA® Tesla V100 SMX2 GPU with 16 GB of RAM, and used the results from these smaller simulations to estimate runtimes for a million samples with the appropriate fidelity on the Summit supercomputer. For m=12,14, the authors estimated it would take 18 s and 88 s, respectively. For m=20, the authors estimated they could compute the samples in $1.67 \times 10^6$ seconds. The alterations to the Gray and Kourtis methodology introduced by Huang et al. were later incorporated into the software library of Gray and Kourtis, CoTenGra. In collaboration with NVIDIA®, CoTenGra contracted a Sycamore-53 m=20 sample in 558 seconds on the Selene GPU cluster.

In another work by Deshpande et al., a three-dimensional random GBS quantum circuit containing 216 modes (6 modes per dimension of the circuit architecture) and a single cycle was proposed to showcase quantum advantage. To map the three-dimensional random GBS circuit to a tensor-network simulation, a truncated Fock space corresponding to a qudit size of 4 was assumed. Using the theoretical compute performance of the Fugaku super-computer, and the CoTenGra contraction path finder, Deshpande et al. found that the 6×6×6 circuit could be computed in $10^{14}$ seconds assuming access to memory well beyond that of all the nodes of Fugaku together, let alone a single node of Fugaku. Slicing the circuit down to sizes that could fit in the 32 GB RAM of a Fugaku node would come with a slicing overhead that was exceedingly high, making this circuit infeasible on current or future supercomputers. Deshpande et al. also studied other three-dimensional GBS circuits and found that the circuit with 5 modes per dimension was also likely intractable, however an amplitude of the circuit with 4 modes per dimension could likely be computed in under an hour on Fugaku. The foregoing indicates that the three-dimensional GBS circuit with 6 modes is well beyond the capabilities of current simulation methods.

Another notable tensor-network simulator is that of Lykov et al., who computed 210-qubit Quantum Approximate Optimization Ansatz (QAOA) circuits with 1785 gates on 1024 nodes of the Cray XC 40 supercomputer Theta. Lykov et al. used a greedy path optimizer, which is known to perform slightly worse than the hypergraph partitioners that AQCDP and CoTenGra use. Lykov et al. coupled the greedy path optimizer with a step-dependent slicing method that determines indices to slice at run-time as the path is contracted. This type of method may be suitable for dynamic task graphs, and could be incorporated into the setup of embodiments set forth herein (e.g., Jet) very naturally. Lykov et al. did not benchmark on Sycamore-53, and thus the extent to which this slicing method would perform against interleaving slicing with subtree-reconfiguration (as was first done in ACQDP and now supported in the current version of CoTenGra) is not known.

The tensor-network simulator ExaTN has been used to perform large quantum circuit simulations on Summit. Nguyen et al. benchmarked ExaTN on Sycamore-53 (m=14), however neither pre-contraction simplifications nor high-quality path optimization were performed, so the run-times of Nguyen et al. are not competitive, despite the computational efficiency of ExaTN being quite high.

Task-Based Parallelism, Task-Based Slicing, and Task-Based Batching

Embodiments of the present disclosure facilitate unprecedented speed-ups in quantum circuit simulations using a simulator that implements task-based parallelism with "task-based slicing" and "task-based batching." A major shortcoming of known simulators is that they do not take advantage of the duplicate work between slice calculations and amplitude calculations. Indeed, there could be work that is redundantly computed billions of times or more, depending on the circuit, contraction path and sliced indices. Furthermore, they do not take advantage of the fact that some contractions in the contraction tree can be performed in parallel, as they are independent. Moreover, known methods provide no support for heterogeneous nodes and concurrent contraction on both the CPU and GPU. With suitable methods, it should be possible not only to reuse duplicate work between slices and amplitudes, but to maximize the number of duplicate contractions, so that the FLOP of the simulations can be more dramatically reduced. Embodiments set forth herein use a combination of task-based parallelism and novel slicing/batching algorithms with shared-work reuse, to eliminate redundant calculation of duplicate work while maximizing the amount of shared work between slices and amplitudes.

In some embodiments, tensor network files storing a contraction path and raw tensor network data are input/received, and a task dependency graph is constructed based on this data. The task dependency graph is then mapped to multiple different compute devices, which may include a CPU, a GPU, and/or one or more other devices, using a task scheduler (e.g., Taskflow's task scheduler). In some such implementations, a search for optimal slices or paths is not performed, to allow for flexibility in regards to which computational methods are used. Additionally, in some implementations, one or more hypergraph partitioning methods with greedy slicing and subtree reconfiguration (e.g., CoTenGra) are used to compute high-quality paths and slices for tensor networks. An overview of the construction of the task-dependency graph from tensor network data is set forth below.

Building the Task Graph for a Contraction

A basic building block of a task-dependency graph is a pairwise contraction of two tensors. The pairwise contraction of two tensors can be decomposed into two independent (e.g., partial) tensor transposes and a single matrix-multiply step. While tensor contractions can be computed using other approaches, a transpose-transpose-matrix-multiply method (e.g., the transpose-transpose-GEMM method) is particularly useful in a task-based setting, as it allows for more parallelism due to the fact that transposes from different contractions in the contraction tree can be executed in parallel. "GEMM" refers to "general matrix multiply," defined as the operation $C=\alpha AB+\beta C$, with A and B as matrix inputs, $\alpha$ and $\beta$ as scalar inputs, and C as a pre-existing matrix which is overwritten by the output. In some implementations of some embodiments, a modified version of the transpose used by the Flexible Quantum Circuit Simulator (qFlex) is used for contractions on one or more CPUs, and the Intel® Math Kernel Library (MKL) or OpenBLAS is used for matrix multiplication. Alternatively or in addition, in some implementations of some embodiments, version 1.3.0 of cuTensor (or similar) is used for tasks performed on one or more GPUs, to leverage the tensor cores of the GPU when available.

Figure 5:
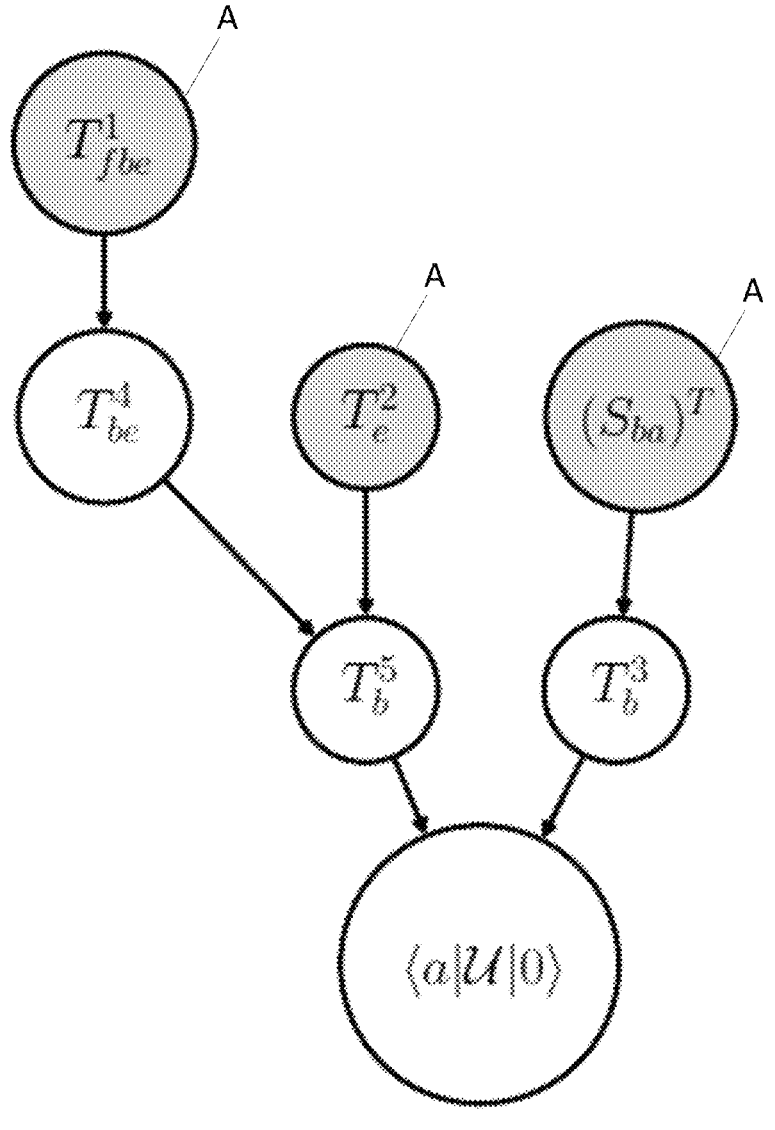
FIG. 5 is a task dependency graph for a single tensor-network contraction for the contraction tree in FIG. 3, according to some embodiments.

In some embodiments, a method for creating a task graph includes looping through a contraction path in a tensor network file, adding the tensor transposes and GEMM multiplies for each contraction in the path. Each transpose is only dependent on the availability of the tensor that it is transposing, and therefore has one dependency. The matrix multiply step is predicated on the completion of two transposes, and thus has two dependencies. The task graph for the calculation of a single amplitude corresponding to the contraction tree in FIG. 3 is shown in FIG. 5. The nodes with a superscript T correspond to transposes, and the nodes without a superscript T correspond to pure matrix multiplies whose result gives the tensor named in the node. In this example, many of the tensors do not need to be transposed before the multiplication because their indices are already in the correct order, so there are far fewer transposes than would occur in more complex examples. Nevertheless, this example clearly shows that nodes highlighted in grey (labelled "A") correspond to tasks which can be computed in parallel. By contrast, in known simulators, which did not use task-based parallelism, taking advantage of this parallelism would not be possible.

As noted above, FIG. 5 shows a task dependency graph for a single tensor-network contraction corresponding to the contraction tree in FIG. 3. All nodes of the task graph of FIG. 5 are named by the computational result of the task, and correspond to the result of matrix-multiply calls (e.g., GEMM matrix multiply calls) except those with superscript T, which correspond to tensor transposes. In this example, the tensor $S_{ba}$ should be transposed because it is on the right side of the contraction between $|0\rangle_a$ and $S_{ba}$. For this example, it would be possible to avoid the transpose by swapping the positions of $|0\rangle_a$ and $S_{ba}$ in the contraction tree, but in general such an operation is not possible without affecting the tensors in the rest of the tree.

Figure 6:
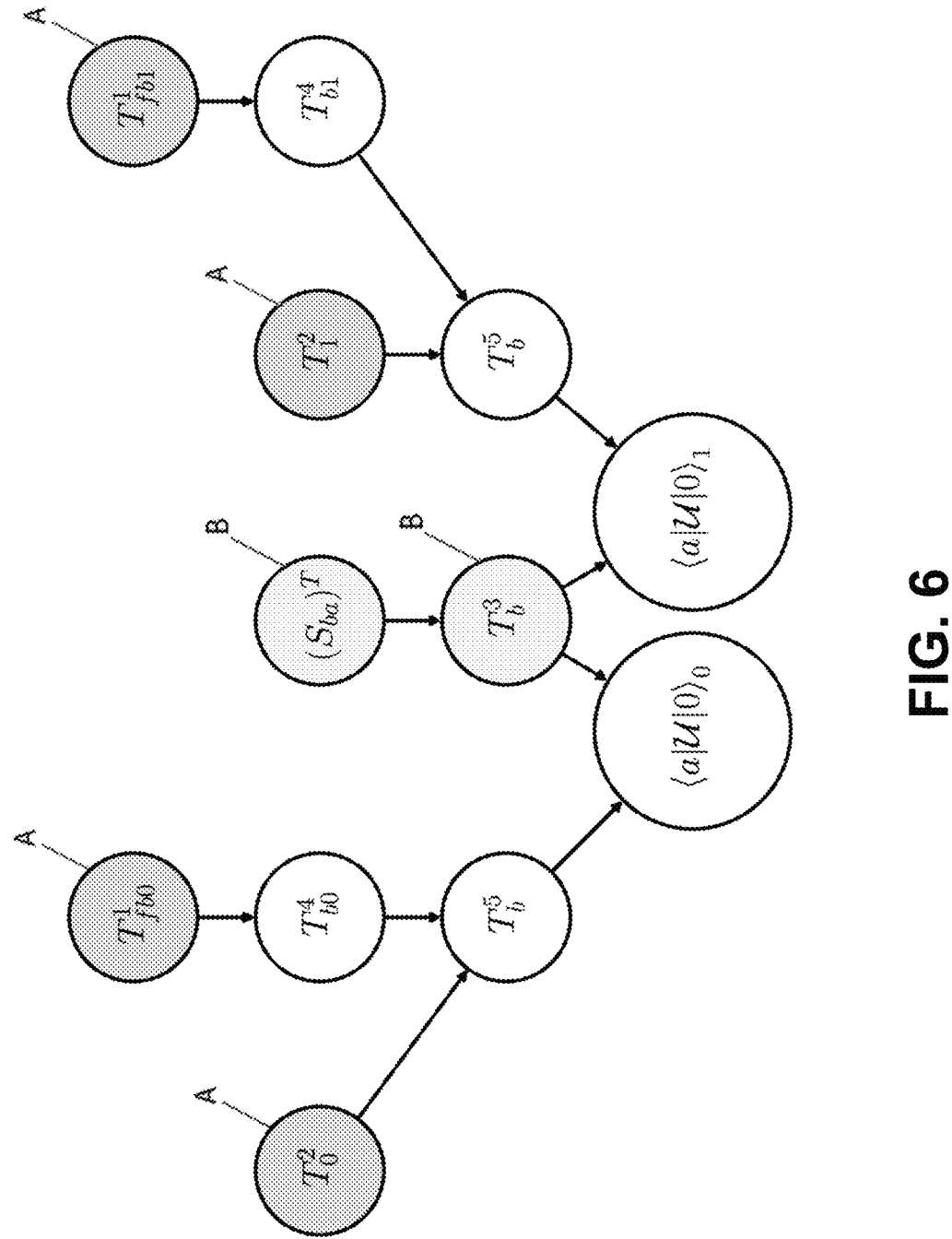
FIG. 6 is a task dependency graph for a multi-contraction of two slices corresponding to the fixed values of the index e: e=0 and e=1, according to some embodiments.

FIG. 6 shows a task dependency graph for a multi-contraction of two slices corresponding to the fixed values of the index e: e=0 and e=1. All colored nodes (i.e. nodes labelled "A" or "B") can be computed concurrently/in parallel. Furthermore, the nodes labelled "B" represent shared work between the two contractions. In previous simulators, the work of node "B" would be computed twice, once for each slice. According to methods of the present disclosure, however, by using tasking, such work can be computed just once.

Building the Task Graph for Multi-Contractions and Reusing Shared Work

In quantum circuit simulation, most computations typically involve multi-contractions. In other words, multiple tensor networks are contracted to obtain some final quantity of interest. Often, these contractions will share work, for example when computing slices. Slicing breaks a single contraction problem into a multi-contraction problem. For large circuits, there will typically be shared work between the sliced contractions. In some embodiments, a method for constructing the task-graph for such a problem includes looping through the contraction path for each of the slices, ignoring redundant calculation by not adding tasks with the same name. Tasks are named by concatenating their contraction path order number with their indices and the slice value associated to that index. This naming scheme avoids collisions when adding multiple slices to the same task graph. An example task graph is shown in FIG. 6. It can be seen in FIG. 6 that the task-graph now contains more nodes labelled "A" or "B," meaning there are more independent computations that can be contracted concurrently. Also, the nodes labelled "B" are shared between the two slice contractions. This means that the work of the B nodes can be computed just once and can then be re-used for the other slice. If additional slices are computed, such work could again be re-used.

Unlike task-based parallelism methods described herein, known simulators did not take advantage of duplicate work. In some embodiments, task-based parallelism can further leverage such duplicate work by maximizing the amount of shared work between multi-contractions. For example, the goal of path and slice finding within a task-based parallelism framework can be to minimize the amount of FLOP per contraction while maximizing the number of duplicate tasks (shared work) between contractions.

The equation that should be minimized is not Eqn. 6, but rather the following:

$$FLOP_{AMP} = f_{SL}FLOP_{SL} + N_{SL}(1 - f_{SL})FLOP_{SL}, \qquad (7)$$

where $f_{SL}$ is the fraction of $FLOP_{SL}$ that contains duplicate tasks between slices. This optimization can be generalized to other forms of multi-contraction, such as computing batches of amplitudes and various methods of sampling quantum circuits, which often involve multi-contractions. The shared work can also be stored onto disk or other memory for future computation.

Building the Task Graph for Concurrent CPU/GPU Contraction

Figure 7:
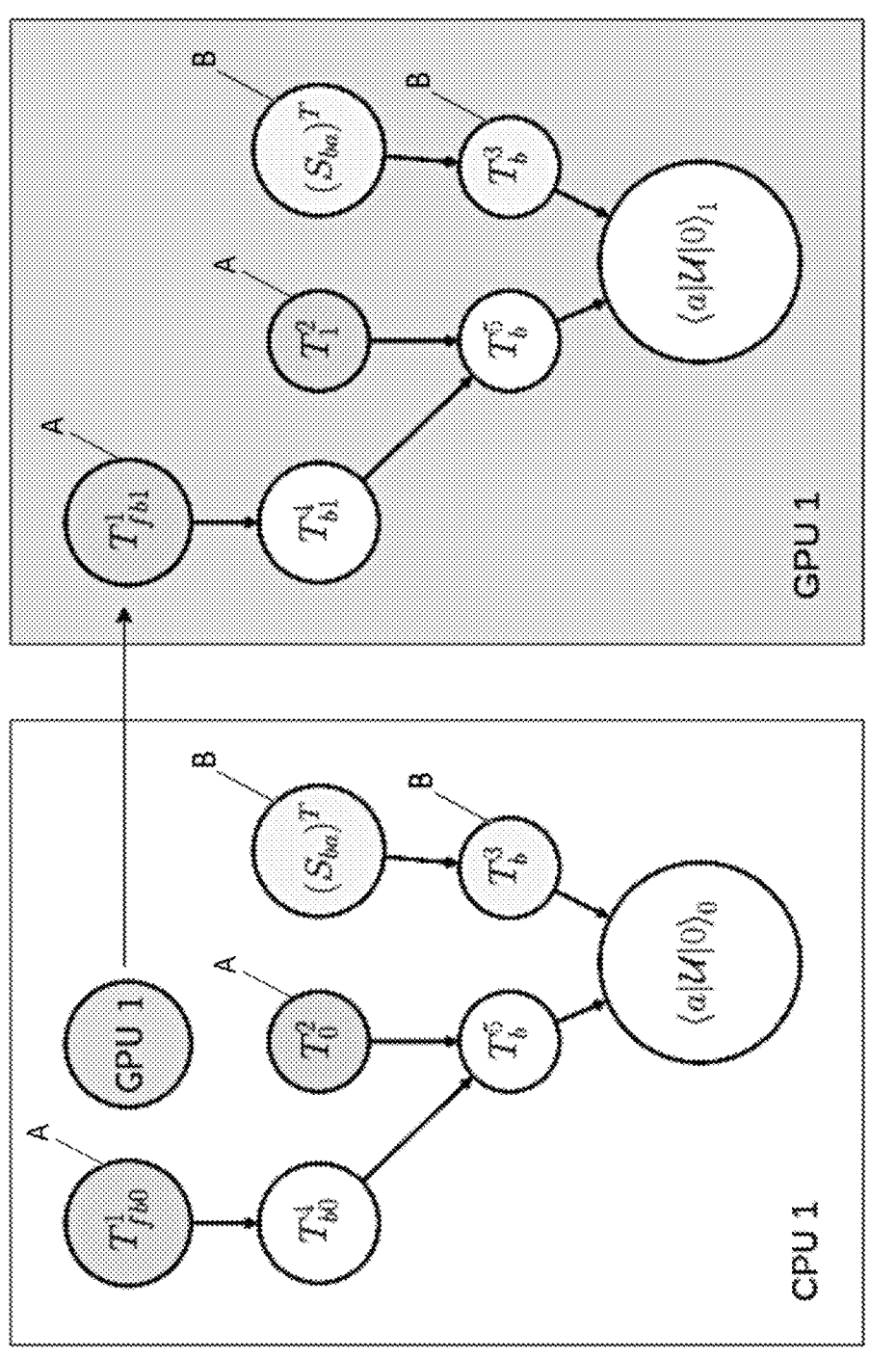
FIG. 7 is a task dependency graph for a concurrent tensor-network contraction on a CPU and GPU of two different slices, according to some embodiments.

In some embodiments (e.g., employing Taskflow), tasking is performed on GPUs using Compute Unified Device Architecture (CUDA™) graphs, as well as tasking on other GPUs and devices through the SYCL portability layer. The entire tensor network contraction can be wrapped into a task for the GPU and added to the task-graph of the CPU. The tensor data can be sent to the GPU prior to contraction, so that the contractions are not slowed down by CPU-to-GPU data transfers. FIG. 7 shows an example task dependency graph for a concurrent tensor-network contraction on one CPU and one GPU (on the same node) of two different slices being contracted concurrently, according to some embodiments. If there are multiple GPUs on a single node, their contraction can be wrapped into a different task and added to the main CPU task graph. Each device may be continuously fed with new slices as contractions are completed, and the shared work can be stored in memory for re-use.

Task-Based Parallelism

Each contraction is a computational task and the contraction tree (e.g., FIG. 3) as a whole represents a dependency graph between these tasks. As discussed above, such a problem can be approached with task-based parallelism. Task-based parallelism focuses on distributing tasks in an efficient manner across different processing units, as opposed to data-parallelism which distributes different pieces of data across processing units performing the same computational task.

Task-based libraries for writing parallel applications, such as Taskflow, Charm++, HPX, and Kokkos have only recently gained popularity with the coming of the exa-scale age of computing. This is because task-based parallelism and variants of the method are expected to efficiently use large supercomputers. In some embodiments, simulators of the present disclosure use Taskflow to implement task-based algorithms. Taskflow facilitates asynchronous heterogeneous task-based computing between CPU and GPUs and can accommodate loop-level parallelism as well as irregular patterns such as graph algorithms and dynamic control flows. In other words, Taskflow provides a set of functions that a developer can use to efficiently add task creation, task dispatching, monitoring, management, and results gathering to an existing software. Additional details on Taskflow can be found in "Cpp-Taskflow: Fast Task-based Parallel Programming using Modern C++," T-W. Huang, et al., *IEEE International Parallel and Distributed Processing Symposium (IPDPS)*, 2019, the content of which is incorporated by reference herein in its entirety.

With previous tensor-network simulators, a single contraction tree would be computed serially, however it can be seen from FIG. 3 that there are multiple independent tasks that could be computed concurrently on different processing units. Thus, a task-based model for the tensor contraction tree facilitates parallel speedups not exhibited by known simulators.

Task-Based Slicing

In a task-based parallelism framework, the interpretation of slicing is different from that of known frameworks. Slicing b and e in a tensor network, for example, may create four binary contraction trees, which equates to four times as many tasks to spread across available processing units. Furthermore, some of these tasks may be duplicates, in which case they should ideally only be computed once. Known simulators did not take advantage of this duplicate work, but with task-based libraries of the present disclosure, it is possible to do so. The goal of slice finding (i.e., the identification of a desired set of binary contraction trees from multiple possible sets of binary contraction trees) within a task-based parallelism framework is then to minimize the amount of FLOP per slice while maximizing the number of duplicate tasks (shared work) between slices. Computing multiple slices at once can, in some instances, have a drawback in that there can be an added memory cost. In a task-based framework, however, deletion tasks can be added that delete intermediate tensors once all calculations which depend on those intermediate tensors ("dependencies") have been computed.

Numerical Results

In this section, an example software implementation, according to one or more embodiments, is examined and compared against known tensor network simulators, with emphasis on a practical context, where device transfer from the CPU and the GPU are part of the measured computation time. While it is desirable to run many different types of circuits and computations, this comparison was restricted to contractions of random amplitudes or slices of Sycamore-53 and three-dimensional GBS circuits, which have both been used or proposed for supremacy experiments. As discussed above, FIG. 7 shows the task dependency graph for a concurrent tensor-network contraction on the CPU and GPU of two different slices. Also in this section, the task-based approach of Jet, set forth herein is benchmarked, and comparisons are made with existing simulators. All benchmarks can be reproduced with scripts provided in the open-source Jet repository. Although many interesting circuits and computations use tensor-network contractions, contractions of random amplitudes or slices of Sycamore-53 and GBS circuits were specifically selected, as both have been used or proposed for quantum advantage tasks. For the Sycamore circuits, circuit files of Arute et al. were used; these circuits are also provided in the CoTenGra repository. To generate the high-dimensional random GBS circuits, the following algorithm ("Algorithm 1") was used:

---

Algorithm 1 Random n-dimensional GBS circuit.

---

The set of parameters dim, width, modes, cycles and r are user-defined. Use q(i) to represent the i-th qumode; S and BS are the squeezer and beam splitter gates respectively. The vertical bar | represents the operation of a gate on a qudit or set of qudits.
1: procedure R Q C
2:    for i ← 1 to dim do
3:       1lens[i] = (width)$^{i-1}$
4:    end for
5:    for k ← 1 to modes do
6:       S(r) | q(k)
7:    end for
8:    for c ← 1 to cycles do
9:       for i ← 1 to dim do
10:          for i ← 1 to modes-1lens[l] do
11:             θ = random(0, 2π)
12:             φ = random(0, 2π)
13:             BS(θ,φ | q(i), q(i + 1lens[l])
14:          end for
15:       end for
16:    end for
17: end procedure

---

In Table I (below), run-time estimates are shown for a random amplitude contraction of a variety of circuits on the fastest supercomputer, Fugaku (with 7,630,848 CPU cores, 32 GB of RAM per node, a LINPACK benchmark of 442 PetaFLOP/s and a mixed-precision HPC-AI benchmark of 2.0 exaFLOP/s). To find the run-time estimates, the contraction path finder CoTenGra was used, and 200 searches each were run for an hour, using the KaHyPar hypergraph partitioner as the search method with default CoTenGra settings for slicing and local reconfiguration, for a max tensor size of $2^{27}$. This set of searches was re-run several times to identify any fluctuations in the fastest estimates, and it was found that the fluctuations were within a factor of 2 or less. The fastest runs are shown in Table I. The code name Sycamore-53-m20 represents "Sycamore-53 to 20 cycles," and GBS-444-ml represents a three-dimensional (4×4×4) GBS circuit to 1 cycle. For all of the GBS circuits, a qudit size of 4 was assumed, which may serve as a lower bound on a computation time for an accurate amplitude calculation. It can be observed from Table 1 that GBS-444-ml is only around an order of magnitude more difficult than Sycamore-53-m20 for random amplitude computation.

To benchmark the code, it was run on the Niagara cluster (which has 40 CPU cores and 202 GB of RAM. In total, the Niagara cluster has 2,024 nodes and a LINPACK benchmark of 3.6 petaFLOP/s) for the CPU benchmarks, and on the Graham cluster for the GPU and hybrid CPU+GPU benchmarks. The Niagara cluster is a large cluster of 2,024 Lenovo SD530 servers with 40 Intel® Skylake cores at 2.4 GHz each (with 20 cores per socket). The Graham cluster is heterogeneous, and benchmarks were run on one of its nodes, having two NVIDIA® P100 Pascal (12 GB HBM2 memory) and two 2.1 GHZ Intel® E5-2683 v4 Broadwell CPUs.

Benchmarks were run on three circuits: Sycamore-53m10, Sycamore-53-m12 and GBS-444-ml.

TABLE 1

Estimated runtimes on the Fugaku supercomputer to contract one amplitude for various Sycamore-53 circuits and the three-dimensional GBS circuits GBS-444-m1 and GBS-666-m1

| Circuit | Slices Max | Tensor Size | Time (s) |
|---|---|---|---|
| Sycamore-53-m10 | 0 | $6.71 \times 10^7$ | $3.04 \times 10^{-8}$ |
| Sycamore-53-m12 | $2^9$ | $1.34 \times 10^8$ | $4.91 \times 10^{-5}$ |
| Sycamore-53-m20 | $2^{25}$ | $2.68 \times 10^8$ | $3.52 \times 10^1$ |
| Sycamore-53-m20 | 0 | $9.00 \times 10^{15}$ | $1.60 \times 10^1$ |
| GBS-444-m1 | $4^{14}$ | $6.71 \times 10^7$ | $3.60 \times 10^2$ |
| GBS-444-m1 | 0 | $4.39 \times 10^{12}$ | $1.65 \times 10^{-1}$ |
| GBS-666-m1 | 0 | $7.92 \times 10^{28}$ | $2.11 \times 10^{14}$ |

The GBS circuits GBS-444-ml and GBS-666-ml have qudits arranged in 4×4×4 and 6×6×6 lattices, and gates were applied to depth 1 (m=1). For the GBS circuits, a qudit-size of 4 was used. The time estimate assumed computation of contractions at the LINPACK benchmark speed for Fugaku, which is 442 PetaFLOP/s, and that the contraction path FLOP is a good estimate of the computational work. Estimates that slice no indices (see the rows with slices=0) and estimates that searched for slices which constrain the rank of intermediary tensors to be below or equal to 27 are shown, as contraction trees with this bound on tensor rank usually fit in the memory of a GPU or CPU on a supercomputer node. All estimates assume single-precision complex numbers.

TABLE 2

Computation times for a single amplitude of the Sycamore-53 circuit on a single node of the Niagara super-computer.

| Simulator | Contraction Time (s) |
|---|---|
| Alibaba AQCDP | 8.44 |
| Quimb/CoTenGra | 7.06 |
| Jet | 0.94 |

In Table 2 above, benchmarks are shown for the computation of one amplitude of Sycamore-53-m10 on a single Niagara CPU node. For the second benchmark shown in Table 2, a single slice of Sycamore-53-m12 was contracted on a single P100 GPU of Graham. A speedup of just under a factor of three was achieved. The speedups could be further increased, for example, by using algorithm auto-tuning (e.g., cuTensor).

Table 2 also shows just under an order of magnitude speed up with respect to Alibaba's simulator ACQDP. The contraction path was kept the same for CoTenGra and Jet. The contraction flops for the ACQDP run were within 5 percent of those for the CoTenGra/Jet runs.

To benchmark Jet's task-based parallelism, simulations were run on the SciNet clusters Niagara and Rouge for CPU benchmarks, and an AWS EC2 P4d virtual instance for GPU benchmarks. Niagara is a large cluster of 2,024 Lenovo SD530 servers with 40 Intel® Skylake cores at 2.4 GHz each (with 20 cores per socket). The Rouge cluster is a single-socket AMD® Epyc 48 core processor at 2.3 GHz. The AWS instance has two Cascade Lake 24-core processors at 3 GHz, with 8 NVIDIA® A100 GPUs each having 40 GB of device memory. All GPU benchmarks were restricted to a single device.

Figure 8A:
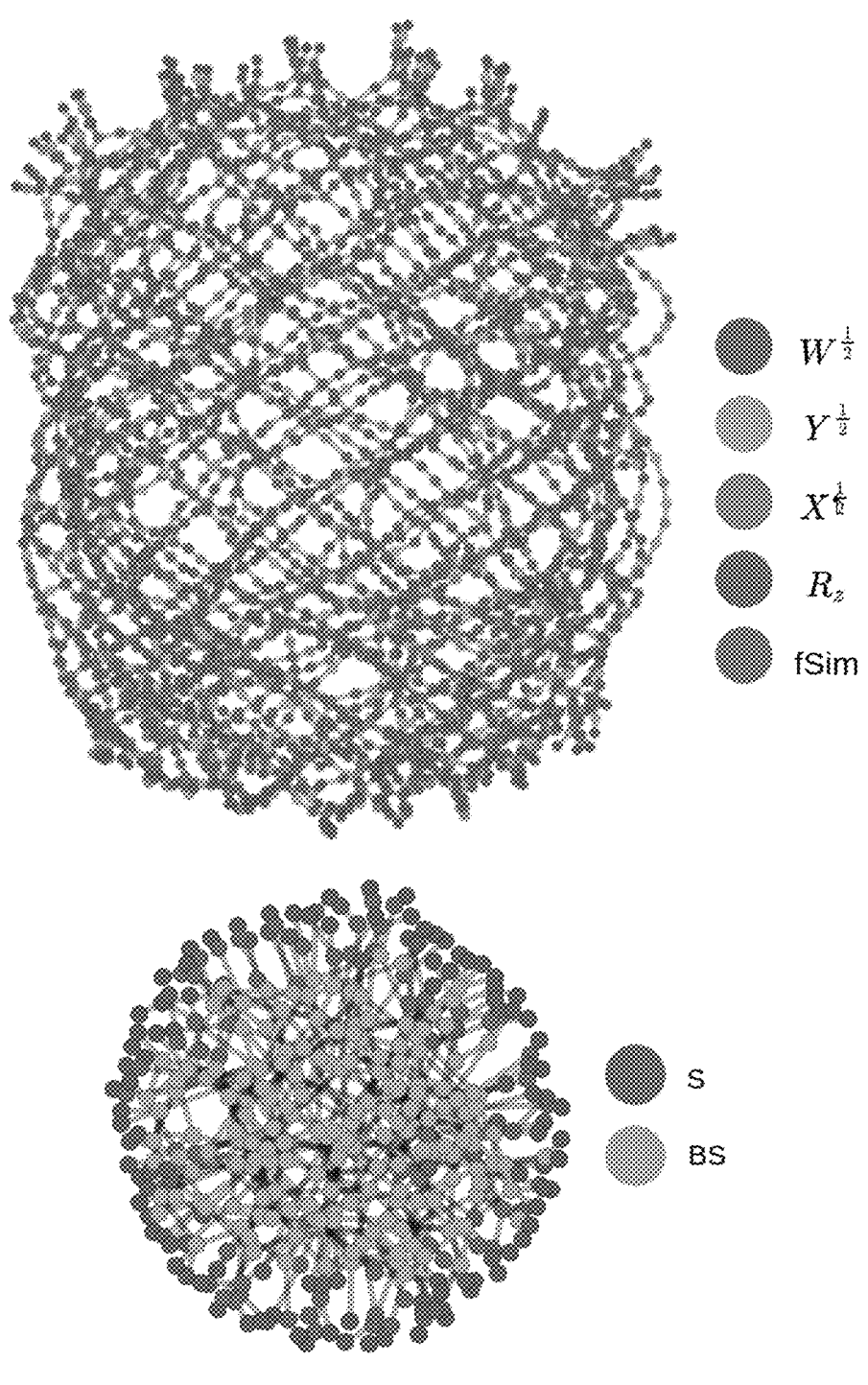
FIGS. 8A-8B show a plot of the Sycamore-53 m=20 circuit and a 4×4×4 GBS circuit with beam splitters (BS) that act as two-qudit gates and squeezers (S) that act as one-qudit gates, according to some embodiments.
Figure 8B:
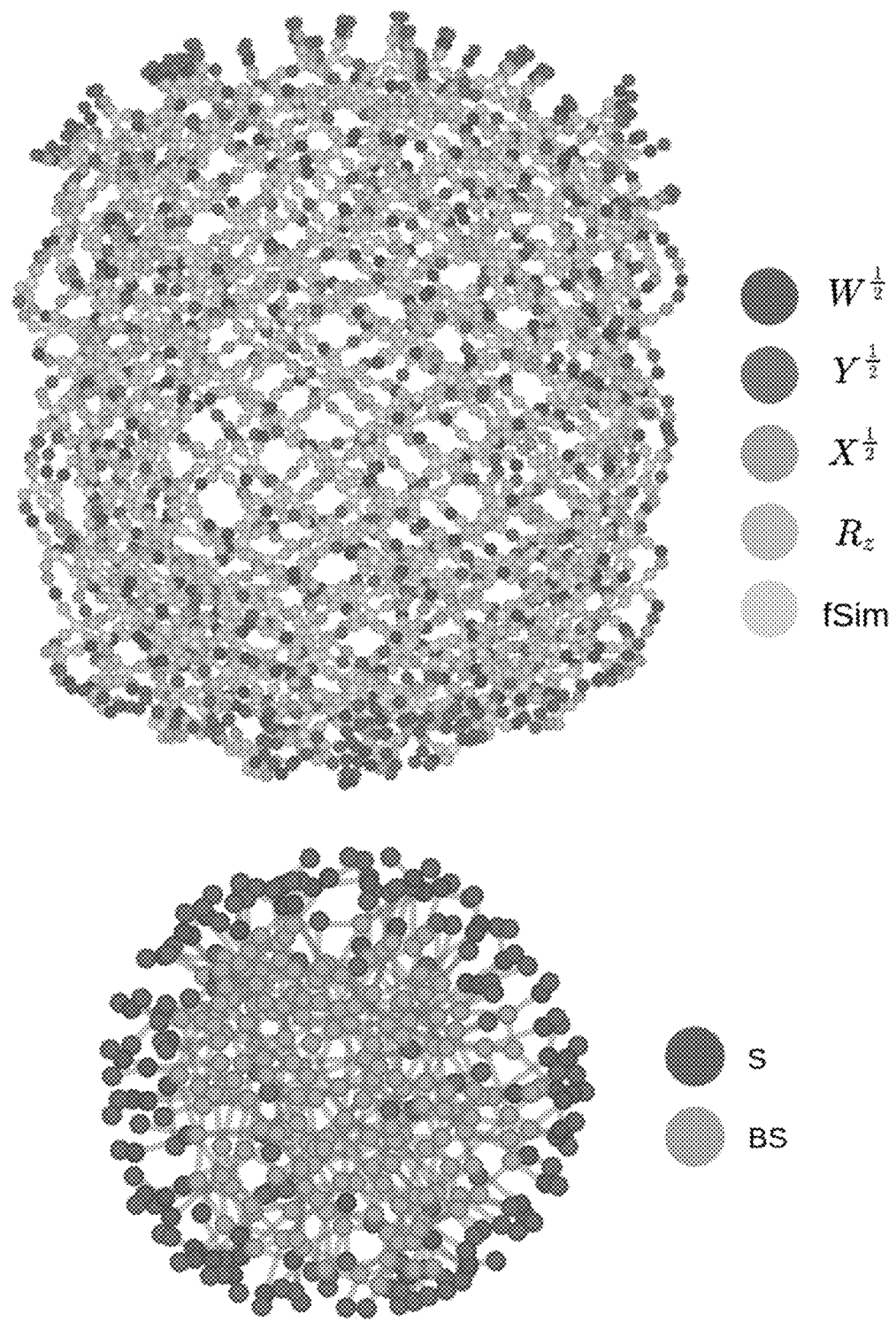

The top portion of each of FIGS. 8A and 8B shows a plot of the Sycamore-53 m=20 circuit. The only two qubit gate is fSim. This circuit appears large due to the inclusion of pre-processing work, and thus could be reduced/simplified by contracting any tensors that don't increase the rank of the resulting tensor. The bottom portion of each of FIGS. 8A and 8B shows a 4×4×4 GBS circuit with beam splitters (BS) that act as two-qudit gates, and squeezers (S) that act as one-qudit gates. Despite the visual difference in size, there is very little pre-processing simplification that can be done with the GBS circuit, whereas for Sycamore-53, the standard pre-processing steps will reduce it as much as ¼ in size.

Figure 9:
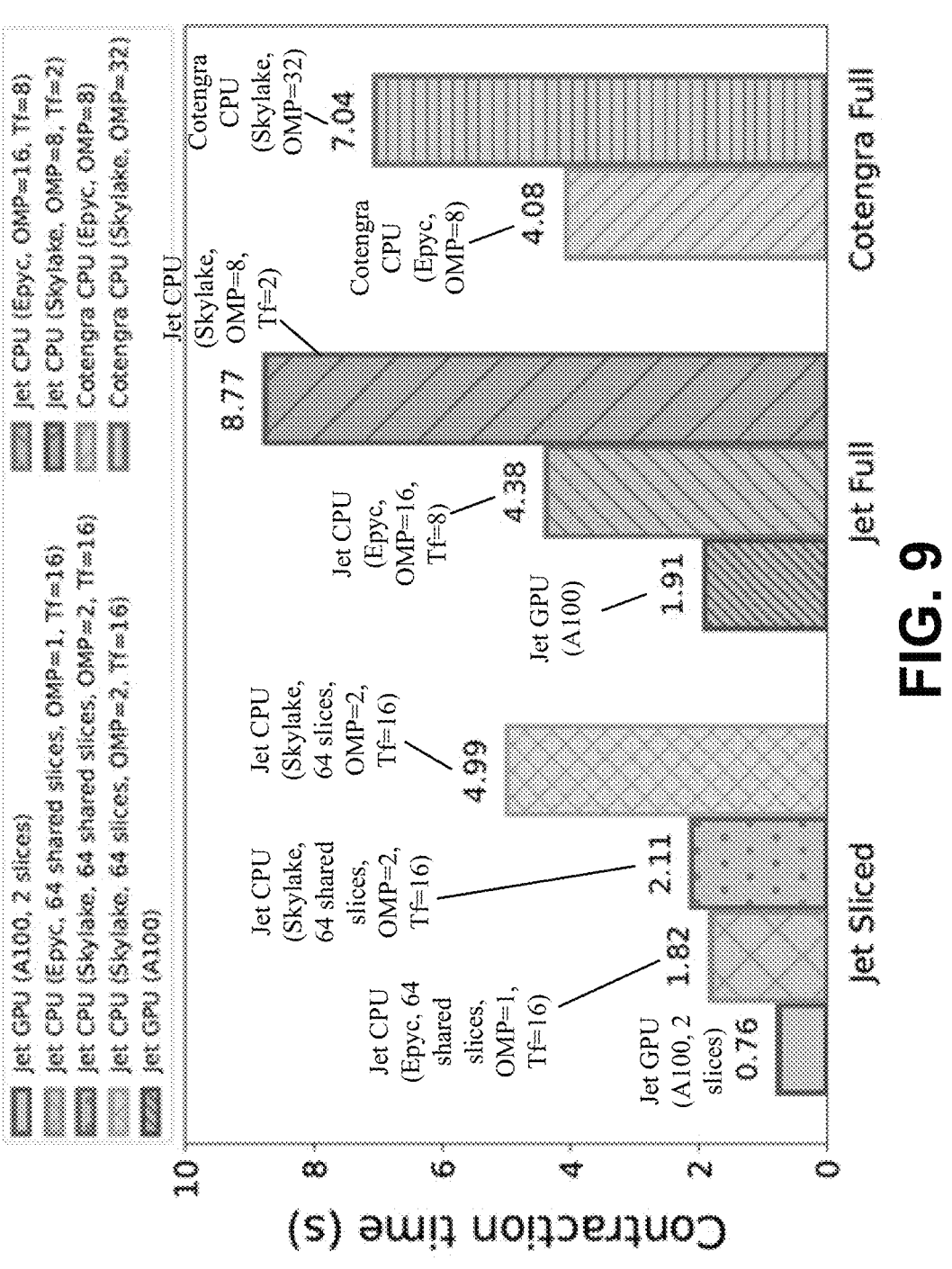
FIG. 9 is a bar chart comparing Jet (full and sliced) and CoTenGra contraction times, according to some embodiments.

In FIG. 9, benchmarks for the computation of one amplitude of Sycamore-53-m10 are showcased across a variety of different systems, with the parameters defining the optimal minimum contraction time for the given problem and hardware, averaged over 10 runs. More specifically, FIG. 9 shows Jet m=10 contraction times for a single amplitude for the full network, and for the sliced network. For comparison, CoTenGra contraction times are also shown for the full network contraction on the available hardware. The OMP values correspond to the optimal OpenMP threads for BLAS operations and parallelised code-paths, and Tf to the Task-flow concurrent threads for the task-graph. As can be seen in FIG. 9, significant benefit is introduced by slicing the network and using shared work, which in the case of the CPU gives approx. 2.4× and 4× speedup on each respective platform, and approx. 2.5× for the GPU.

As can be seen in FIG. 9, Jet is comparable to CoTenGra for CPU-based tensor contractions, where the work is shown on a full network contraction using both Intel® and AMD® CPUs. In addition, the effect of slicing for performance is demonstrated, as well as the use of GPUs, showing that the performance of the contractions is drastically improved by slicing the network, e.g., due to the inherent parallelism offered by the method. For the AMD® Epyc system, slicing 6 edges (64 slices), and using 1 OpenMP thread and 16 concurrent Taskflow threads reduced the runtime by over a factor of 2. For the Skylake node, the improvement was almost a factor of 4, using 2 OpenMP threads and 16 concurrent tasks. Additionally, for the A100 GPU example, approximately a 2.5-fold difference was achieved. This improvement in performance can be attributed to any of at least the following factors:

1. By slicing the network, the task graph can be filled with work for individual slices, to be operated on in parallel, thereby reducing the results once all contractions are completed. This embarrassingly parallel approach facilitates the exploitation of multiple-cores/devices.
2. The task-based framework allows for easy control of the number of concurrent threads, enabling the above tasks to be consumed as the cores become available.
3. Contraction operations described herein include combinations of BLAS-3 calls (compute bound) and data permutations (memory-bandwidth bound). Slicing reduces overall tensor sizes, and thus allows more data through the memory bus during permutations, thereby reducing BLAS-3 overhead and enabling better overall performance. The runtime difference between Skylake and Epyc nodes is likely attributed to the memory bus differences between these hardware.
4. The tasks resulting from slicing that have shared work with other slices, facilitating a reduction in the overall operations needed to contract the network.

Continuing the discussion of FIG. 9, for the m=10 dataset, slices were greedily selected along a fixed contraction path to maximize shared work as much as possible. The chosen contraction path and set of slices achieved a savings of 45.2 GFLOP (out of a total of 97.2 GFLOP) through use of shared work. Computation time was also reduced because the shared transpose tasks were also no longer needed. In total, the use of shared work provided a r≈47% savings in FLOP, which is reflected in the more than twofold speedup between the sliced Skylake run that used shared work (the bar annotated with 2.11 s in FIG. 9) and the sliced Skylake run that did not use the shared work (the bar annotated with 4.99 s in FIG. 9). To obtain similar savings in FLOP for larger circuits or tensor-networks with different geometries could involve using an increased-accuracy method for finding slices and contraction paths that maximize shared work.

Figure 10:
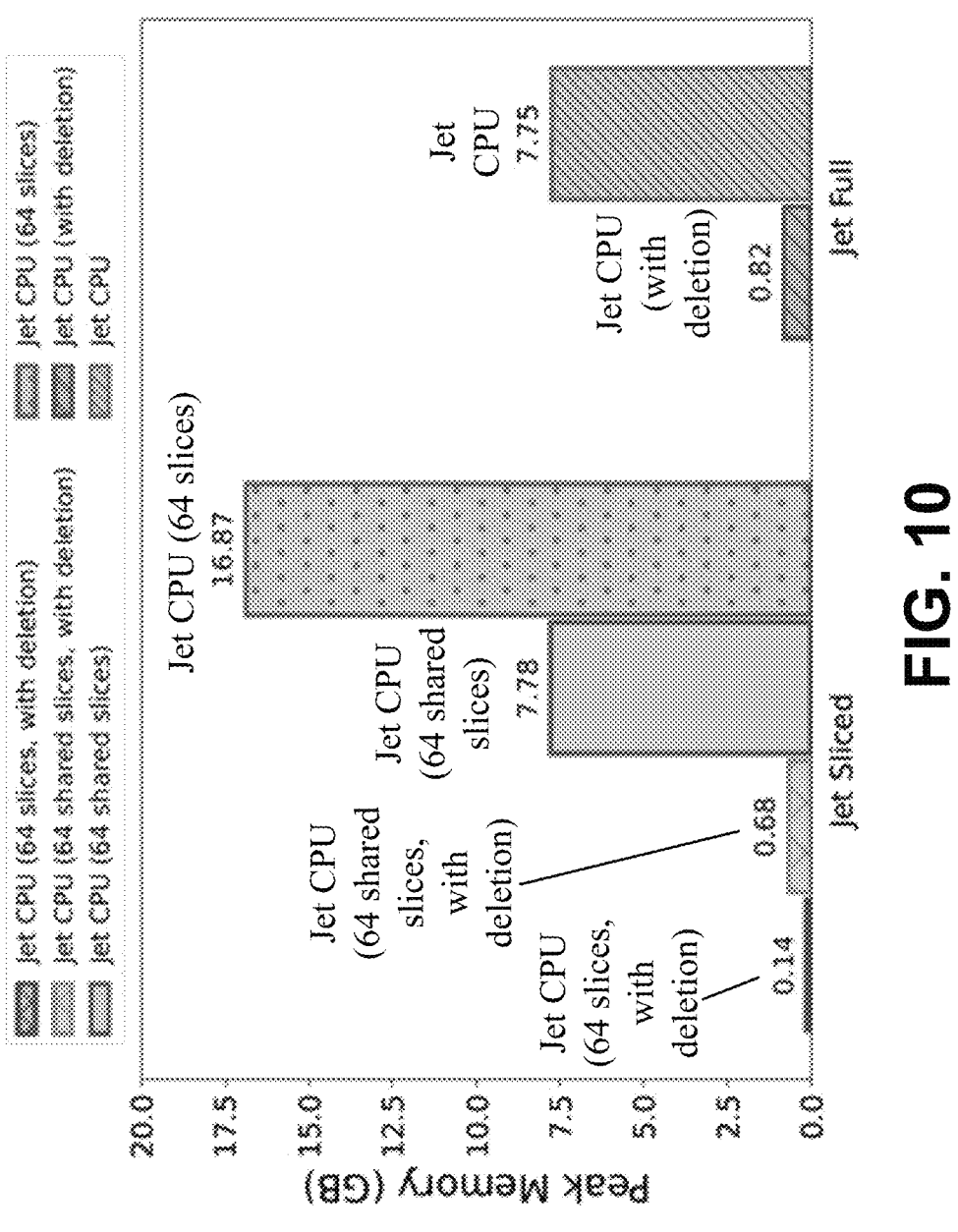
FIG. 10 is a bar chart comparing Jet (full and sliced) peak memory consumption, according to some embodiments.

FIG. 10 shows Jet m=10 peak memory consumption in gigabytes (GB) for a single amplitude of the full network and the sliced network. Each simulation was run on a single Skylake node using one thread. The bars labelled "with deletion" correspond to runs where intermediary tensors were deleted once no longer needed. For each of the three different runs, two bars were plotted—one bar for the contraction without deletion of intermediary tensors and a second bar for the contraction with deletion. Reading from left to right, the bars in order represent: Jet CPU (64 slices, with deletion), Jet CPU (64 shared slices, with deletion), Jet CPU (64 shared slices, without deletion), Jet CPU (64 slices, without deletion), Jet CPU (with deletion), and Jet CPU (without deletion). From FIG. 10, it can be seen that deleting intermediary tensors results in drastic savings in memory. In the case of the sliced run that does not use shared work, a decrease can be seen in the memory consumption by a factor of ≈120. It can also be observed that the sliced run that uses shared work (the 0.68 GB bar in FIG. 10) consumes more memory than when the shared work is not used (the 0.14 GB bar in FIG. 10). This is believed to be due to the extra shared intermediary tensors that are stored in memory, which is a minor drawback of using shared-work when slicing. For tensor-networks bigger than the one associated with the m=10 circuit, the number of slices will grow so that only a subset can be held in memory at a given time. For such cases, the size of this subset can be determined a priori to avoid difficulties with this task-based approach as the tensor network grows larger.

Figure 11:
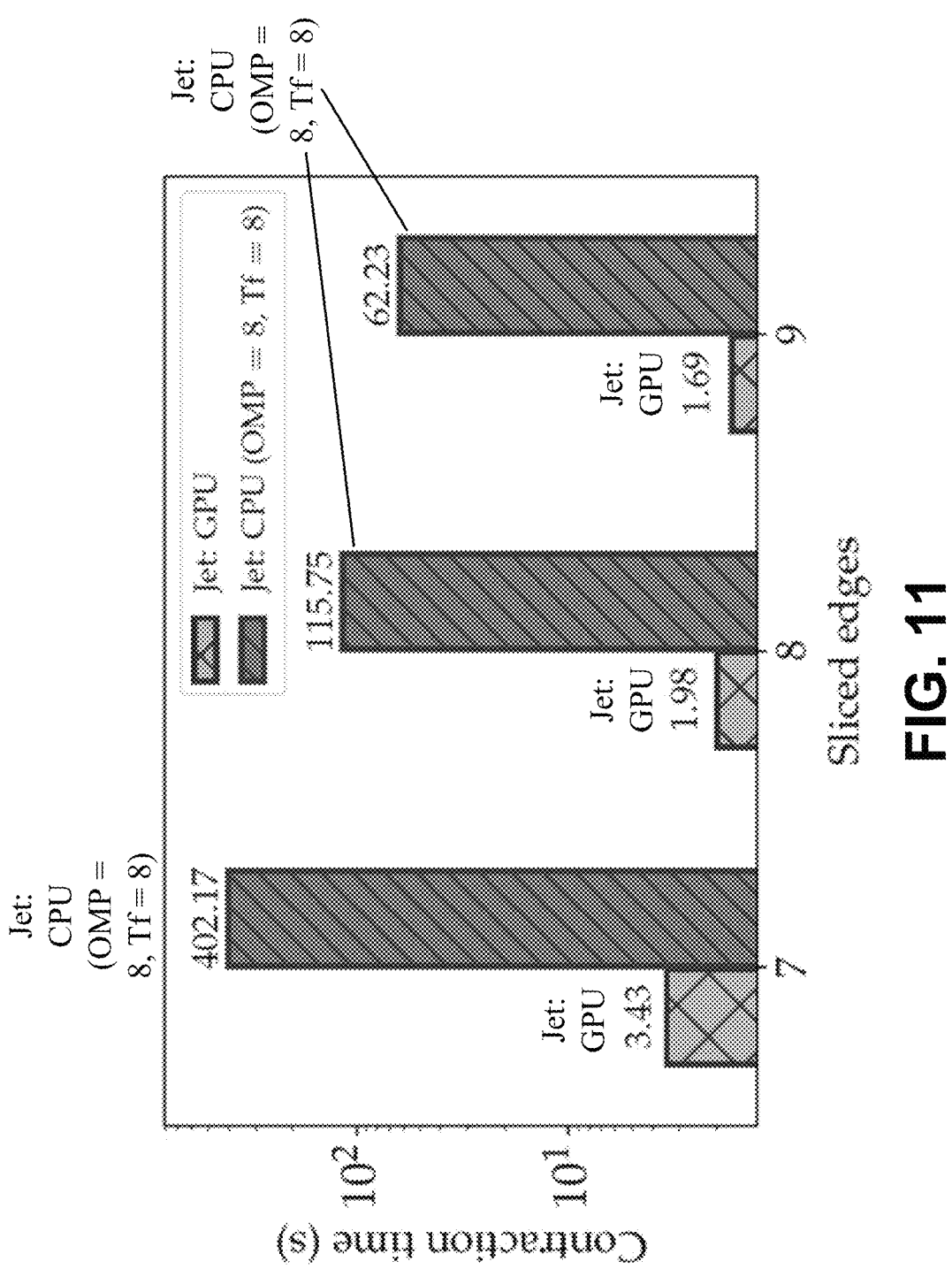
FIG. 11 is a bar chart showing runtime performance for a Jet simulator using CPU and GPU backends, according to some embodiments.

FIG. 11 shows runtime performance of Jet using CPU and GPU backends to contract a single slice of m=12. The number of sliced edges determines the sliced width, with lower numbers associated with a larger amount of data to be contracted. The CPU code ran using 8 OpenMP threads and 8 concurrent Taskflow threads, giving the optimal performance on a Niagara Skylake node. The GPU code ran on an NVIDIA® A100 node with 40 GB of on-board memory. Both codes used 32-bit floating point values for the complex components (complex<float> and cuComplex). FIG. 11 shows a significant performance difference between running Jet on an NVIDIA® A100 GPU and a node of the Niagara supercomputer (Skylake CPU). For the optimal runtime parameters, the GPU is approximately 2 orders of magnitude faster than the CPU, illustrating the gains one can obtain by using GPUs for contraction problems.

Figure 12:
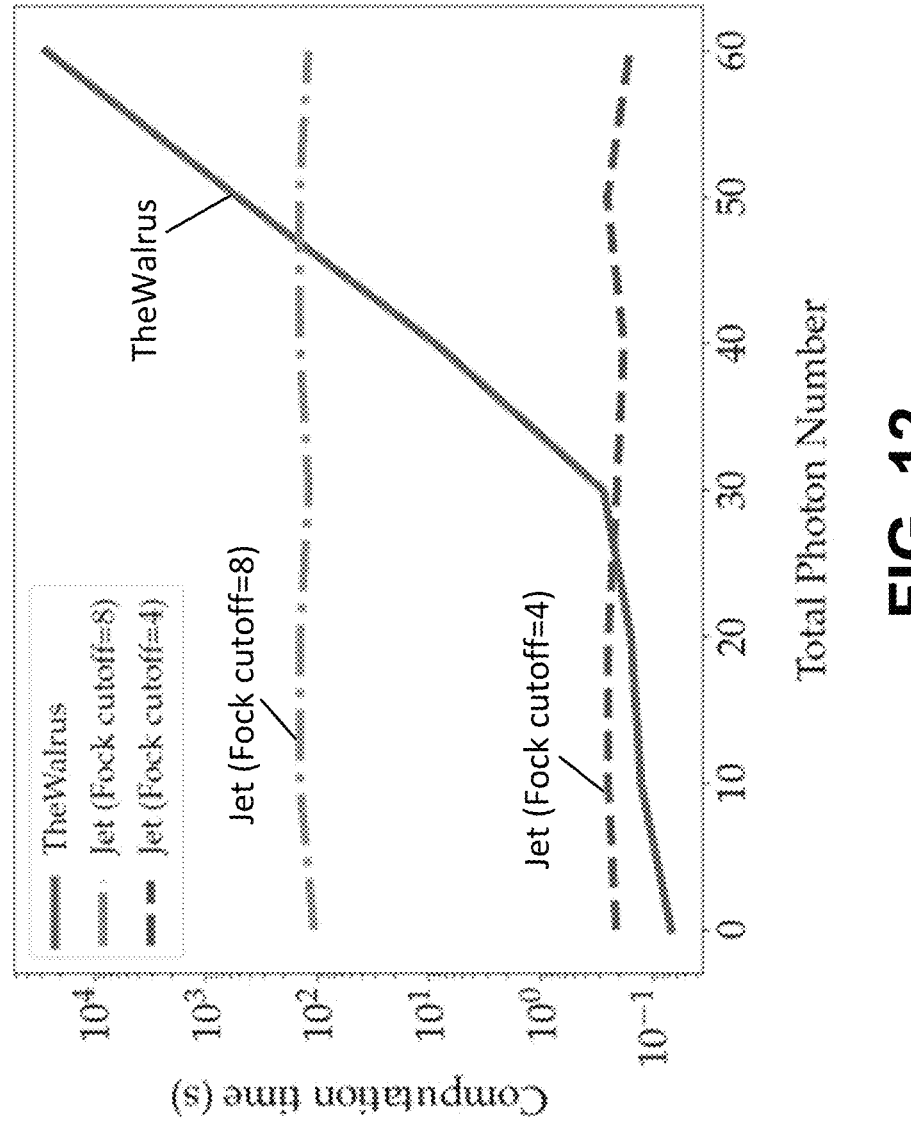
FIG. 12 is a plot comparing Jet and TheWalrus computation times, according to some embodiments.

To the authors' knowledge, no known tensor-network simulators can run GBS supremacy circuits. As such, Jet was benchmarked against TheWalrus code, which computes amplitudes of GBS circuits by calculating a hafnian. Since 3-dimensional random GBS circuits are computationally expensive, benchmarking was performed on the 2-dimensional random GBS circuit GBS-88-ml with a squeezing parameter r=0.5. For the tensor-network simulations, Fock basis cutoffs of 4 and 8 were used for the tensors here. The same random amplitude was computed using both TheWalrus and Jet with differing total photon number, 1, and the results are shown in FIG. 12 (discussed below). The Fock states used for the amplitudes were generated by computing a sequence of random integers in the range [0, 4), with the total sum of these integers representing the total photon number, 1.

FIG. 12 shows that TheWalrus computation time grows exponentially, whereas the computation time of Jet remains relatively constant across total photon number at a fixed Fock cutoff. The consistent nature of Jet's computation is believed to be due to the fact that, at a fixed Fock cutoff, changing the total photon number only changes the values of some of the tensors in the network, but does not change the sizes of these tensors or the contraction path. Due to the Fock basis truncation, however, there is approximation error inherent in the Jet amplitude calculation. This approximation error can become larger as the total photon number increases.

FIG. 12 shows Jet and TheWalrus computation times for random amplitudes with different total photon numbers on a single node of the Niagara supercomputer. The amplitudes were generated by computing a sequence of random integers in the range [0,4), with the total sum of these integers representing the total photon number. Results were computed with Jet using single-precision complex numbers, and using double-precision complex numbers in TheWalrus (as this is natively supported). Although this difference in number type is expected to slow TheWalrus by roughly a constant factor of 2, it does not explain the orders of magnitude difference in speed or scaling behavior observed.

TABLE 3

GPU run times for Jet and CoTenGra on one slice of Sycamore-53-m12, which has a total of 512 slices in our runs.

| Circuit | Simulator | Runtime (s) |
| --- | --- | --- |
| Sycamore-53-m12 | CoTenGra | 1.41(17.37) |
| Sycamore-53-m12 | Jet | 0.55 |

For Table 3, only one slice was computed, for ease of comparison. The runtimes provided include the device transfer time. For CoTenGra, the contraction was run multiple times since CoTenGra uses the jax XLA just-in-time engine, which increases in speed the second time it is run. The time in parenthesis is for the first CoTenGra run. These times were collected by running the individual simulators using a single NVIDIA® P100 Pascal (12 GB HBM2 memory) on a node of the Graham supercomputer. No CPU was used in the contraction for this benchmark.

In a further benchmark, shown in Table 4 below, the hybrid CPU/GPU capabilities of Jet are shown, for slices of the GBS-444-ml circuit. The contract speeds (i.e., the slices per second of contraction) of the run on a single GPU and CPU vs. two GPUs and CPU on a Graham dual P100 node are shown. Good scaling ($\approx$1.9 speedup) was achieved, particularly considering that 2GPU+CPU isn't exactly twice the performance of GPU+CPU on a Graham node.

TABLE 4

Slice computation speeds for Jet on a Graham supercomputer node.

| Circuit | Simulator | Device | Speed (s$^{-1}$) |
| --- | --- | --- | --- |
| GBS-444-m1 | jet | GPU + CPU | 1.83 |
| GBS-444-m1 | jet | 2GPU + CPU | 3.46 |

Device transfer times are included in the calculations of Table 4. For the 2GPU+CPU run, the speed was computed by dividing the number of slices (6 per GPU and 1 per CPU, for a total of 13) computed by the runtime. For the GPU+CPU run, 7 slices were computed (6 on the GPU, 1 on the CPU) and divided by the runtime. The runtime on two GPUs was nearly double the performance 1.9) which, taking into account that the maximum theoretical speedup is under 2x, means the task scheduler and the device transfers do not slow down the computation significantly. FIG. 13 is a flowchart showing a method for simulating a quantum circuit using task-based slicing, according to some embodiments. As shown in FIG. 13, the method 1300 includes receiving, at 1302, a representation of a quantum circuit at a processor and identifying, at 1304, multiple contraction trees (each contraction tree from the multiple contraction trees being a "slice" of the representation of the quantum circuit) based on the representation of the quantum circuit. Each of the contraction trees represents a tensor network from a set of tensor networks. At 1306, a first subset of multiple tasks, from a set of tasks associated with the multiple contraction trees, is assigned to a first set of at least one compute device having a first type. At 1308, a second subset of multiple tasks mutually exclusive of the first subset of multiple tasks is assigned to a second set of at least one compute device having a second type different from the first type. The quantum circuit is then simulated, at 1310, by executing the first subset of tasks via the first set of at least one compute device and executing the second subset of tasks via the second set of at least one compute device.

In some implementations, the identifying the multiple contraction trees at 1304 is also based on the multiple contraction trees having an associated amount of shared work that is no smaller than an associated amount of shared work for each remaining plurality of contraction trees from a set of pluralities of contraction trees. Alternatively or in addition, the identifying the multiple contraction trees at 1304 is also based on the multiple contraction trees having a number of associated floating point-operations (FLOPs) that is no greater than a number of associated FLOPs for each remaining plurality of contraction trees from a set of pluralities of contraction trees.

In some implementations, the representation of the quantum circuit includes a tensor network, and each task from the plurality of tasks includes a summation of contracted indices of the tensor network.

In some implementations, the simulating (at 1310) produces a representation of an amplitude of a qudit of the quantum circuit during operation of the quantum circuit, the method further comprising outputting the representation of the amplitude.

In some implementations, the representation of the quantum circuit includes a plurality of sample representations of the quantum circuit.

In some implementations, the simulating the quantum circuit includes asynchronously executing the first subset of tasks via the first set of at least one compute device and the second subset of tasks via the second set of at least one compute device.

In some implementations, the simulating the quantum circuit includes executing the first subset of tasks via the first set of at least one compute device concurrently with executing the second subset of tasks via the second set of at least one compute device.

In some implementations, the method also includes identifying a shared task that is common to the first subset of tasks and the second subset of tasks. The executing the first subset of tasks is performed via the first set of at least one compute device including executing the shared task, and the executing of at least a portion of the second subset of tasks is performed via the second set of at least one compute device not including executing the shared task.

In some implementations, the first set of at least one compute device includes one of: a graphics processing unit (GPU), a central processing unit (CPU), or a field programmable gate array (FPGA). The second set of at least one compute device may include at least a remaining one of the GPU, the CPU, or the FPGA.

In some embodiments, one or more tasks associated with one or more contraction trees of a quantum circuit are each divided into three or more sets of sub-tasks, and the three or more sets of sub-tasks are assigned to three or more different types of compute devices for execution thereon.

Task-Based Batching

Further improvements, beyond those achievable using task-based slicing, can be achieved when the goal is to calculate batches of amplitudes instead of just one amplitude. Batch calculations are used in classical supremacy simulations of Sycamore 53, where batches of roughly 2,000 amplitudes, corresponding to randomly selected "bit-strings," are needed to simulate the entire m=20 supremacy experiment to the appropriate fidelity. The difference between the contraction trees of different amplitude calculations are the tasks whose sub-trees involve shared indices of tensors in the final state. Thus, to benefit from task-based parallelism, the amount of shared work between the contraction trees of different amplitudes should be maximized, by minimizing the number of tasks whose sub-trees involve shared indices of tensors in the final state. In other words, a contraction order and a set of sliced indices should be identified that minimize:

$$\text{FLOP}_{BATCH}=f_{AMP}\text{FLOP}_{AMP}+N_{AMP}(1-f_{AMP})\text{FLOP}_{AMP}, \quad (7)$$

Here, $f_{AMP}$ is the fraction of FLOP shared between tasks of different amplitude calculations, $N_{AMP}$ is the number of amplitudes in the batch, and $\text{FLOP}_{AMP}$ is as defined in Eqn. 6. Again, the contractions that are shared between amplitudes can be stored on disk and pre-loaded before an amplitude computation, and thus the first term in Eqn. 7 is effectively eliminated.

FIG. 14 is a flowchart showing a method for simulating a quantum circuit using task-based batching, according to some embodiments. As shown in FIG. 14, the method 1400 includes identifying, at 1402, a plurality of contraction trees based on a representation of at least one quantum circuit (e.g., a set of sample representations provided by a user via a software interface, graphical user interface, transmitted signal representing the sample representations, etc.). Each contraction tree from the plurality of contraction trees can represent a tensor network from a plurality of tensor networks. For each contraction tree from the plurality of contraction trees, an associated set of sub-trees (each sub-tree from the set of sub-trees being a "batch" of the associated contraction tree from the plurality of contraction trees) is identified at 1404. At 1406, a first subset of multiple tasks, from a plurality of tasks associated with that set of sub-trees, is assigned to a first set of at least one compute device having a first type, and at 1408, a second subset of multiple tasks from the plurality of tasks associated with that set of sub-trees is assigned to a second set of at least one compute device having a second type different from the first type. The second subset of multiple tasks can be mutually exclusive of the first subset of multiple tasks. A simulated amplitude of a qubit of the quantum circuit during operation of the quantum circuit is calculated at 1410, for that set of sub-trees, by executing the first subset of multiple tasks via the first set of at least one compute device and executing the second subset of multiple tasks via the second set of at least one compute device. Steps 1404-1410 are performed for each contraction tree from the plurality of contraction trees identified at 1402.

In some implementations, the identifying the plurality of contraction trees at 1402 is also based on a criterion that includes at least one of: maximizing an amount of shared work or minimizing a number of associated floating-point operations (FLOPs).

In some implementations, the representation of the quantum circuit includes a tensor network, and each task from the plurality of tasks includes a summation of contracted indices of the tensor network.

In some implementations, the representation of the at least one quantum circuit includes a plurality of samples of the at least one quantum circuit.

In some implementations, the calculating the simulated amplitude, at 1410, for each contraction tree from the plurality of contraction trees includes asynchronously executing the first subset of tasks for that contraction tree via the first set of at least one compute device and the second subset of tasks for that contraction tree via the second set of at least one compute device.

In some implementations, the calculating the simulated amplitude, at 1410, for each contraction tree from the plurality of contraction trees includes executing the first subset of tasks for that contraction tree via the first set of at least one compute device concurrently with executing the second subset of tasks for that contraction tree via the second set of at least one compute device.

In some implementations, the method 1400 also includes, for each contraction tree from the plurality of contraction trees, identifying a shared task that is common to the first subset of tasks for that contraction tree and the second subset of tasks for that contraction tree. The executing of the first subset of tasks for that contraction tree is performed via the first set of at least one compute device including executing the shared task, and the executing of at least a portion of the second subset of tasks for that contraction tree is performed via the second set of at least one compute device not including executing the shared task.

In some implementations, the method 1400 also includes identifying a shared task that is common to a first contraction tree from the plurality of contraction trees and a second contraction tree from the plurality of contraction trees, where the first subset of tasks of the first contraction tree includes the shared task, and the second subset of tasks of the first contraction tree does not include the shared task.

In some implementations, the method 1400 also includes deleting an intermediate tensor from at least one contraction tree from the plurality of contraction trees in response to detecting that all dependencies of the at least one contraction tree from the plurality of contraction trees have been computed.

In some implementations, the identification at 1404 of the set of sub-trees for each contraction tree from the plurality of contraction trees is based on a criterion that includes at least one of: maximizing an amount of shared work or minimizing a number of associated floating-point operations (FLOPs).

In some implementations, the first set of at least one compute device includes one of: a graphics processing unit (GPU), a central processing unit (CPU), or a field programmable gate array (FPGA). The second set of at least one compute device can include at least a remaining one of the GPU, the CPU, or the FPGA.

FIG. 15 is a flowchart showing a method for simulating a quantum circuit using task-based slicing, according to some embodiments. As shown in FIG. 15, the method 1500 includes receiving, at 1502, at a processor and from a requestor compute device associated with a requestor, a representation of a quantum circuit. A plurality of contraction trees associated with the quantum circuit is identified at 1504 based on the representation of the quantum circuit (optionally without notifying the requestor), with each contraction tree from the plurality of contraction trees being a "slice" of the representation of the quantum circuit and representing a tensor network from a plurality of tensor networks. A set of compute devices is identified at 1506 (optionally without notifying the requestor), from a plurality of candidate sets of compute devices, to perform a plurality of tasks associated with the plurality of contraction trees. The method 1500 also includes (1) causing execution (e.g., by sending a command signal) of a first subset of tasks from the plurality of tasks on a first compute device from the set of compute devices, where the first compute device has a first type (optionally without notifying the requestor), and (2) causing execution (e.g., by sending a command signal) of a second subset of tasks from the plurality of tasks on a second compute device from the set of compute devices, where the second compute device has a second type different from the first type (optionally without notifying the requestor), at 1508A and 1508B, respectively. Note that, although shown and described with reference to FIG. 15 as involving two subsets of tasks and execution on two compute devices of different types, other quantities of subsets of tasks and compute device types are also possible (e.g., 3, 4, 5, etc.) without departing from the scope of the present disclosure. The method 1500 also includes causing transmission, at 1510, of a signal representing a simulation result to the requestor compute device. The simulation result is based on the execution of the first subset of tasks and the execution of the second subset of tasks.

In some implementations, each of the identifying the plurality of contraction trees (1504), the identifying the set of compute devices (1506), the execution of the first subset of tasks (1508A), and the execution of the second subset of tasks (1508B) is performed without notifying the requestor.

In some implementations, the set of compute devices includes at least one local computing resource and at least one remote computing resource.

In some implementations, the identifying the plurality of contraction trees at 1504 is further based on a criterion that includes at least one of: maximizing an amount of shared work or minimizing a number of associated floating-point operations (FLOPs).

In some implementations, the method 1500 also includes partitioning the plurality of tasks to produce the first subset of tasks and the second subset of tasks, where at least one of the assigning the first subset of tasks to the first compute device or the assigning the second subset of tasks to the second compute device is based on the partitioning. Such partitioning can be based on one or more of: one or more properties of each task from the plurality of tasks, one or more machine learning algorithms (e.g., supervised learning, unsupervised learning, or reinforcement learning), one or more statistical classification techniques, or one or more artificial neural networks (ANNs) (e.g., deep neural networks (DNNs)).

Figure 16:
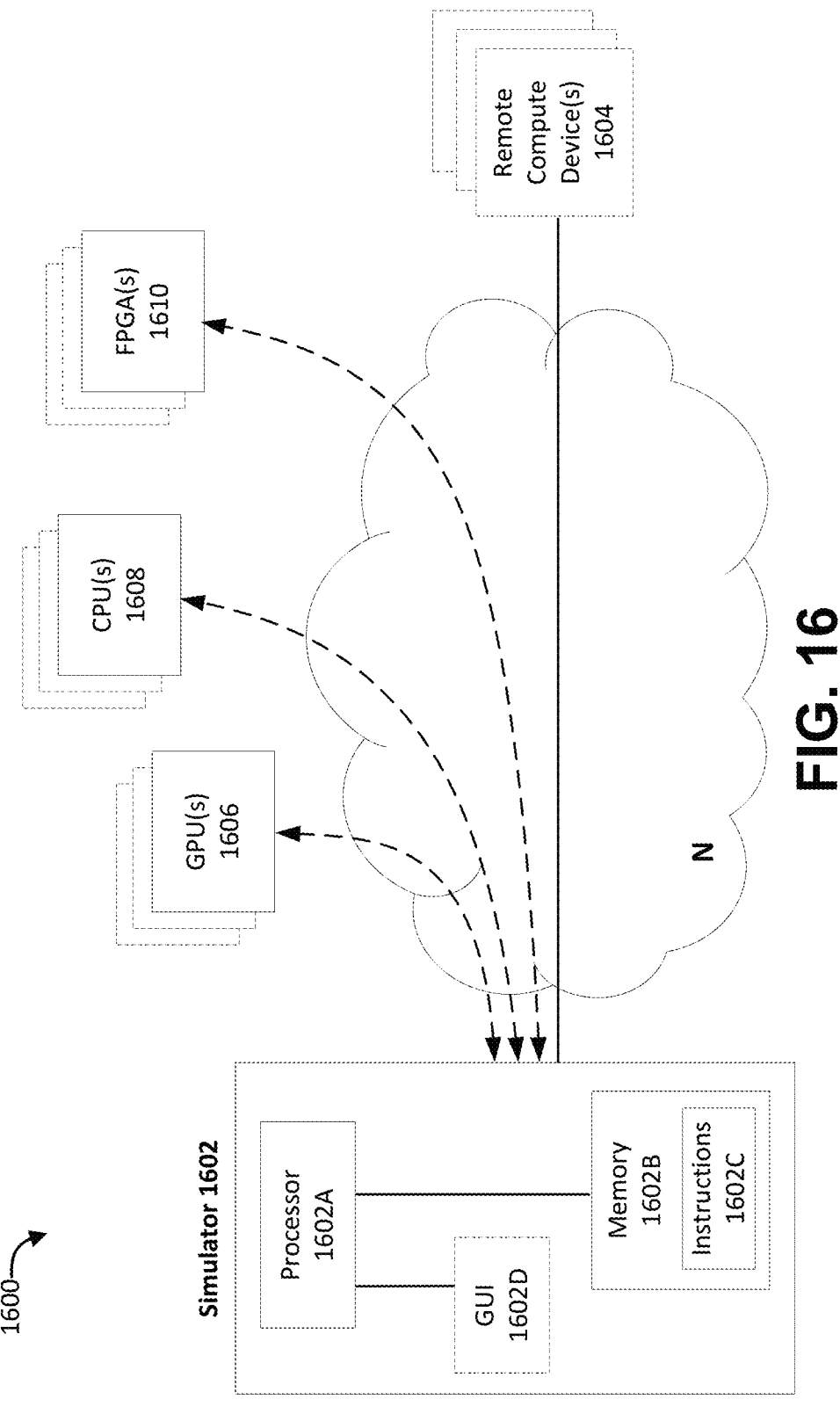
FIG. 16 is a diagram of a system for simulating quantum circuits, according to some embodiments.

FIG. 16 is a diagram of a system for simulating quantum circuits, according to some embodiments. As shown in FIG. 16, the system 1600 includes a simulator 1602, implemented in hardware and/or software, that includes a processor 1602A operably coupled to a memory 1602B storing instructions 1602C, and optionally operably coupled to a graphical user interface (GUI) 1602D. The instructions 1602C can include instructions to perform any or all of the steps of methods 1300 (FIG. 13), 1400 (FIG. 14), and 1500 (FIG. 15). The simulator 1602 is in network communication (e.g., wireless or wired communication) with one or more GPUs 1606, one or more CPUs 1608, and/or one or more FPGAs 1610, via a network N, for example to distribute tasks for parallel or overlapping (e.g., concurrent or partially concurrent) computation. The simulator 1602 is also in network communication (e.g., wireless or wired communication) with one or more remote compute devices 1604, for example to receive representations of quantum circuits (e.g., step 1502 of method 1500 in FIG. 15) therefrom. Once one or more simulation results have been computed by the simulator 1602, the one or more simulation results may be sent to the remote compute device(s) 1604 (e.g., via a signal representing the simulation results and transmitted via the network N).

Although shown and described, with reference to FIG. 16, as being in network communication with one another, in other embodiments, the simulator 1602 can be in peer-to-peer communication with the one or more GPUs 1606, the one or more CPUs 1608, and/or the one or more FPGAs 1610 (or a subset thereof, optionally in addition to network communication with others of the one or more GPUs 1606, the one or more CPUs 1608, and/or the one or more FPGAs 1610).

The use of task-based parallelism for tensor-network simulation of quantum circuits, as set forth herein, provides multiple benefits that have not preciously been achieved by known simulators. First, mapping the problem to a task-based framework allows for more parallelism without any extra work. Second, shared work can be used and even maximized during the search for low-cost contraction orders and slices. Furthermore, this shared work can be pre-computed and stored on disk to be used for any applicable slice or amplitude calculation for that circuit. Third, a task-based method allows for better memory management as the tensors associated with tasks that no longer have any dependencies can be deleted on the fly, which in turn will allow for less slicing as the total memory needed is reduced. Lastly, task-based libraries allow for asynchronous CPU and GPU computation on heterogeneous machines, which will be highly desirable as supercomputer nodes grow more heterogeneous. As described herein, for the first time, Sycamore-53 supremacy circuits are compared with GBS circuits.

Tasking embodiments described herein can be extended/applied to tensor networks with structures such as matrix product states (MPS), projected entangled pair states (PEPS), tree tensor networks and multi-scale entanglement renormalization ansatz tensor networks. Alternatively or in addition, methods can be implemented to maximize shared work between multi-contractions, for example using Eq. 7.

In some embodiments, a processor-readable medium stores instructions to cause a processor to receive a representation of a quantum circuit, and to identify, based on the representation of the quantum circuit, a plurality of contraction trees associated with the quantum circuit. Each contraction tree from the plurality of contraction trees represents a tensor network from a plurality of tensor networks. The processor-readable medium also stores instructions to cause the processor to assign a first subset of multiple tasks, from a plurality of tasks associated with the plurality of contraction trees, to a first set of at least one compute device having a first type, and to assign a second subset of multiple tasks from the plurality of tasks associated with the plurality of contraction trees to a second set of at least one compute device having a second type different from the first type. The second subset of multiple tasks can be mutually exclusive of the first subset of multiple tasks. The processor-readable medium also stores instructions to cause the processor to simulate the quantum circuit by causing execution of the first subset of tasks via the first set of at least one compute device and causing execution of the second subset of tasks via the second set of at least one compute device.

In some implementations, the instructions to cause the processor to identify the plurality of contraction trees associated with the quantum circuit include instructions to identify the plurality of contraction trees based on the plurality of contraction trees having an associated amount of shared work that is no smaller than an associated amount of shared work for each remaining plurality of contraction trees from a set of pluralities of contraction trees.

In some implementations, the instructions to cause the processor to identify the plurality of contraction trees associated with the quantum circuit include instructions to identify the plurality of contraction trees based on the plurality of contraction trees having a number of associated floating-point operations (FLOPs) that is no greater than a number of associated FLOPs for each remaining plurality of contraction trees from a set of pluralities of contraction trees.

In some implementations, the representation of the quantum circuit includes a tensor network, and each task from the plurality of tasks includes a summation of contracted indices of the tensor network.

In some implementations, the instructions to cause the processor to simulate the quantum circuit result in the production of a representation of an amplitude of a qudit of the quantum circuit during operation of the quantum circuit, and the processor-readable medium further stores instructions to cause the processor to output the representation of the amplitude.

In some implementations, the representation of the quantum circuit includes a plurality of sample representations of the quantum circuit.

In some implementations, the instructions to cause the processor to simulate the quantum circuit include instructions to cause asynchronous execution of the first subset of tasks via the first set of at least one compute device and of the second subset of tasks via the second set of at least one compute device.

In some implementations, the instructions to cause the processor to simulate the quantum circuit include instructions to cause execution of the first subset of tasks via the first set of at least one compute device concurrently with causing execution of the second subset of tasks via the second set of at least one compute device.

In some implementations, the processor-readable medium further stores instructions to cause the processor to identify a shared task that is common to the first subset of tasks and the second subset of tasks, the execution of the first subset of tasks including executing the shared task, and the execution of at least a portion of the second subset of tasks not including executing the shared task.

In some implementations, the first set of at least one compute device includes one of: a graphics processing unit (GPU), a central processing unit (CPU), or a field programmable gate array (FPGA). Alternatively or in addition, the second set of at least one compute device can include at least a remaining one of the GPU, the CPU, or the FPGA.

In some embodiments, a processor-readable medium stores instructions to cause a processor to identify, based on a representation of at least one quantum circuit, a plurality of contraction trees, each contraction tree from the plurality of contraction trees representing a tensor network from a plurality of tensor networks. The processor-readable medium also stores instructions to cause the processor, for each contraction tree from the plurality of contraction trees, to identify an associated set of sub-trees and to assign a first subset of multiple tasks, from a plurality of tasks associated with that set of sub-trees, to a first set of at least one compute device having a first type. The processor-readable medium also stores instructions to cause the processor, for each contraction tree from the plurality of contraction trees, to assign a second subset of multiple tasks from the plurality of tasks associated with that set of sub-trees to a second set of at least one compute device having a second type different from the first type, the second subset of multiple tasks being mutually exclusive of the first subset of multiple tasks. The processor-readable medium also stores instructions to cause the processor, for each contraction tree from the plurality of contraction trees, to calculate a simulated amplitude of a qubit of the quantum circuit during operation of the quantum circuit, for that set of sub-trees, by causing execution of the first subset of multiple tasks via the first set of at least one compute device and causing execution of the second subset of multiple tasks via the second set of at least one compute device.

In some implementations, the instructions to identify the plurality of contraction trees include instructions to identify the plurality of contraction trees based on a criterion that includes at least one of: maximizing an amount of shared work or minimizing a number of associated floating point operations (FLOPs).

In some implementations, the representation of the quantum circuit includes a tensor network, and each task from the plurality of tasks includes a summation of contracted indices of the tensor network.

In some implementations, the representation of the at least one quantum circuit includes a plurality of samples of the at least one quantum circuit.

In some implementations, the instructions to cause the processor to calculate the amplitude for each contraction tree from the plurality of contraction trees include instructions to cause asynchronous execution of the first subset of tasks for that contraction tree via the first set of at least one compute device and the second subset of tasks for that contraction tree via the second set of at least one compute device.

In some implementations, the instructions to cause the processor to calculate the amplitude for each contraction tree from the plurality of contraction trees include instructions to cause execution of the first subset of tasks for that contraction tree via the first set of at least one compute device concurrently with causing execution of the second subset of tasks for that contraction tree via the second set of at least one compute device.

In some implementations, the processor-readable medium also stores instructions to cause the processor to, for each contraction tree from the plurality of contraction trees, identify a shared task that is common to the first subset of tasks for that contraction tree and the second subset of tasks for that contraction tree. The instructions to cause execution of the first subset of tasks for that contraction tree via the first set of at least one compute device can include instructions to cause execution of the shared task, and the instructions to cause execution of at least a portion of the second subset of tasks for that contraction tree via the second set of at least one compute device may not include causing execution of the shared task.

In some implementations, the processor-readable medium also stores instructions to cause the processor to identify a shared task that is common to a first contraction tree from the plurality of contraction trees and a second contraction tree from the plurality of contraction trees. The first subset of tasks of the first contraction tree can include the shared task, and the second subset of tasks of the first contraction tree may not include the shared task.

In some implementations, the processor-readable medium also stores instructions to cause the processor to delete an intermediate tensor from at least one contraction tree from the plurality of contraction trees in response to detecting that all dependencies of the at least one contraction tree from the plurality of contraction trees have been computed.

In some implementations, the instructions to identify the set of sub-trees for each contraction tree from the plurality of contraction trees include instructions to identify the sets of sub-trees based on a criterion that includes at least one of: maximizing an amount of shared work or minimizing a number of associated floating point operations (FLOPs).

In some implementations, the first set of at least one compute device includes one of: a graphics processing unit (GPU), a central processing unit (CPU), or a field programmable gate array (FPGA). Alternatively or in addition, the second set of at least one compute device can include at least a remaining one of the GPU, the CPU, or the FPGA.

In some embodiments, a processor-readable medium stores instructions to cause a processor to receive, from a requestor compute device associated with a requestor, a representation of a quantum circuit. The processor-readable medium also stores instructions to cause the processor to identify, based on the representation of the quantum circuit, a plurality of contraction trees associated with the quantum circuit, each contraction tree from the plurality of contraction trees representing a tensor network from a plurality of tensor networks. The processor-readable medium also stores instructions to cause the processor to identify a set of compute devices, from a plurality of candidate sets of compute devices, to perform a plurality of tasks associated with the plurality of contraction trees. The processor-readable medium also stores instructions to cause the processor to cause execution of a first subset of tasks from the plurality of tasks on a first compute device from the set of compute devices, the first compute device having a first type. The processor-readable medium also stores instructions to cause the processor to cause execution of a second subset of tasks from the plurality of tasks on a second compute device from the set of compute devices, the second compute device having a second type different from the first type. The processor-readable medium also stores instructions to cause the processor to cause transmission of a signal representing a simulation result to the requestor compute device, the simulation result based on the execution of the first subset of tasks and the execution of the second subset of tasks.

In some implementations, the instructions to cause the processor to identify the plurality of contraction trees include instructions to cause the processor to identify the plurality of contraction trees without notifying the requestor.

In some implementations, the instructions to cause the processor to identify the set of compute devices include instructions to cause the processor to identify the set of compute devices without notifying the requestor. Alternatively or in addition, the instructions to cause the processor to cause execution of the first subset of tasks can include instructions to cause the processor to cause execution of the first subset of tasks without notifying the requestor. Alternatively or in addition, the instructions to cause the processor to cause execution of the second subset of tasks can include instructions to cause the processor to cause execution of the second subset of tasks without notifying the requestor.

In some implementations, the set of compute devices includes at least one local computing resource and at least one remote computing resource.

In some implementations, the instructions to cause the processor to identify the plurality of contraction trees include instructions to cause the processor to identify the plurality of contraction trees based on a criterion that includes at least one of: maximizing an amount of shared work or minimizing a number of associated floating-point operations (FLOPs).

In some implementations, the processor-readable medium also stores instructions to cause the processor to partition the plurality of tasks to produce the first subset of tasks and the second subset of tasks, and at least one of the instructions to assign the first subset of tasks to the first compute device or the instructions to assign the second subset of tasks to the second compute device includes instructions to assign based on the partitioning.

While various embodiments have been described and illustrated herein, a variety of other means and/or structures for performing the function and/or obtaining the results and/or one or more of the advantages described herein, and each of such variations and/or modifications are possible. More generally, all parameters, dimensions, materials, and configurations described herein are meant to be examples and that the actual parameters, dimensions, materials, and/or configurations will depend upon the specific application or applications for which the disclosure is used. It is to be understood that the foregoing embodiments are presented by way of example only and that other embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
receiving, at a processor, a representation of a quantum circuit;
identifying, based on the representation of the quantum circuit, a plurality of contraction trees associated with the quantum circuit, each contraction tree from the plurality of contraction trees representing a tensor network from a plurality of tensor networks;
assigning a first subset of multiple tasks, from a plurality of tasks associated with the plurality of contraction trees, to a first set of at least one compute device having a first type;
assigning a second subset of multiple tasks from the plurality of tasks associated with the plurality of contraction trees to a second set of at least one compute device having a second type different from the first type, the second subset of multiple tasks being mutually exclusive of the first subset of multiple tasks;
identifying a shared task that is common to the first subset of multiple tasks and the second subset of multiple tasks; and
simulating the quantum circuit by executing the first subset of multiple tasks via the first set of at least one compute device and executing the second subset of multiple tasks via the second set of at least one compute device, the executing the first subset of multiple tasks via the first set of at least one compute device including executing the shared task, and the executing of at least a portion of the second subset of multiple tasks via the second set of at least one compute device not including executing the shared task.

2. The method of claim 1, wherein the identifying the plurality of contraction trees is further based on the plurality of contraction trees having an associated amount of shared work that is no smaller than an associated amount of shared work for each remaining plurality of contraction trees from a set of pluralities of contraction trees.

3. The method of claim 1, wherein the identifying the plurality of contraction trees is further based on the plurality of contraction trees having a number of associated floating-point operations (FLOPs) that is no greater than a number of associated FLOPs for each remaining plurality of contraction trees from a set of pluralities of contraction trees.

4. The method of claim 1, wherein the representation of the quantum circuit includes a tensor network, and each task from the plurality of tasks includes a summation of contracted indices of the tensor network.

5. The method of claim 1, wherein the simulating produces a representation of an amplitude of a qudit of the quantum circuit during operation of the quantum circuit, the method further comprising outputting the representation of the amplitude.

6. The method of claim 1, wherein the representation of the quantum circuit includes a plurality of sample representations of the quantum circuit.

7. The method of claim 1, wherein the simulating the quantum circuit includes asynchronously executing the first subset of multiple tasks via the first set of at least one compute device and the second subset of multiple tasks via the second set of at least one compute device.

8. The method of claim 1, wherein the simulating the quantum circuit includes executing the first subset of multiple tasks via the first set of at least one compute device concurrently with executing the second subset of multiple tasks via the second set of at least one compute device.

9. The method of claim 1, wherein the first set of at least one compute device includes one of: a graphics processing unit (GPU), a central processing unit (CPU), or a field programmable gate array (FPGA).

10. The method of claim 1, wherein the second set of at least one compute device includes at least a remaining one of the GPU, the CPU, or the FPGA.

11. A method, comprising:

identifying, based on a representation of at least one quantum circuit, a plurality of contraction trees, each contraction tree from the plurality of contraction trees representing a tensor network from a plurality of tensor networks;

for each contraction tree from the plurality of contraction trees:

identifying an associated set of sub-trees;

assigning a first subset of multiple tasks, from a plurality of tasks associated with that set of sub-trees, to a first set of at least one compute device having a first type;

assigning a second subset of multiple tasks from the plurality of tasks associated with that set of sub-trees to a second set of at least one compute device having a second type different from the first type, the second subset of multiple tasks being mutually exclusive of the first subset of multiple tasks;

calculating a simulated amplitude of a qubit of the quantum circuit during operation of the quantum circuit, for that set of sub-trees, by executing the first subset of multiple tasks via the first set of at least one compute device and executing the second subset of multiple tasks via the second set of at least one compute device; identifying a shared task that is common to the first subset of multiple tasks for that contraction tree and the second subset of multiple tasks for that contraction tree;

the executing the first subset of multiple tasks for that contraction tree via the first set of at least one compute device including executing the shared task; and the executing of at least a portion of the second subset of multiple tasks for that contraction tree via the second set of at least one compute device not including executing the shared task.

12. The method of claim 11, wherein the identifying the plurality of contraction trees is further based on a criterion that includes at least one of: maximizing an amount of shared work or minimizing a number of associated floating point operations (FLOPs).

13. The method of claim 11, wherein the representation of the quantum circuit includes a tensor network, and each task from the plurality of tasks includes a summation of contracted indices of the tensor network.

14. The method of claim 11, wherein the representation of the at least one quantum circuit includes a plurality of samples of the at least one quantum circuit.

15. The method of claim 11, wherein the calculating, for each contraction tree from the plurality of contraction trees, the amplitude includes asynchronously executing the first subset of multiple tasks for that contraction tree via the first set of at least one compute device and the second subset of multiple tasks for that contraction tree via the second set of at least one compute device.

16. The method of claim 11, wherein the calculating, for each contraction tree from the plurality of contraction trees, the amplitude includes executing the first subset of multiple tasks for that contraction tree via the first set of at least one compute device concurrently with executing the second subset of multiple tasks for that contraction tree via the second set of at least one compute device.

17. The method of claim 11, further comprising deleting an intermediate tensor from at least one contraction tree from the plurality of contraction trees in response to detecting that all dependencies of the at least one contraction tree from the plurality of contraction trees have been computed.

18. The method of claim 11, wherein the identification of the set of sub-trees for each contraction tree from the plurality of contraction trees is based on a criterion that includes at least one of: maximizing an amount of shared work or minimizing a number of associated floating point operations (FLOPs).

19. The method of claim 11, wherein the first set of at least one compute device includes one of: a graphics processing unit (GPU), a central processing unit (CPU), or a field programmable gate array (FPGA).

20. The method of claim 19, wherein the second set of at least one compute device includes at least a remaining one of the GPU, the CPU, or the FPGA.

21. A method, comprising:

receiving, at a processor and from a requestor compute device associated with a requestor, a representation of a quantum circuit;

identifying, based on the representation of the quantum circuit, a plurality of contraction trees associated with the quantum circuit, each contraction tree from the plurality of contraction trees representing a tensor network from a plurality of tensor networks;

identifying a set of compute devices, from a plurality of candidate sets of compute devices, to perform a plurality of tasks associated with the plurality of contraction trees;

identifying a shared task that is common to a first subset of multiple tasks from the plurality of tasks and to a second subset of multiple tasks from the plurality of tasks;

causing execution of the first subset of multiple tasks from the plurality of tasks on a first compute device from the set of compute devices, the first compute device having a first type;

causing execution of the second subset of multiple tasks from the plurality of tasks on a second compute device from the set of compute devices, the second compute device having a second type different from the first type, the execution of the second subset of multiple tasks not including executing the shared task; and causing transmission of a signal representing a simulation result to the requestor compute device, the simulation result based on the execution of the first subset of multiple tasks and the execution of the second subset of multiple tasks.

22. The method of claim 21, wherein the identifying the plurality of contraction trees is performed without notifying the requestor.

23. The method of claim 21, wherein the identifying the set of compute devices is performed without notifying the requestor.

24. The method of claim 21, wherein the execution of the first subset of multiple tasks is performed without notifying the requestor.

25. The method of claim 24, wherein the execution of the second subset of multiple tasks is performed without notifying the requestor.

26. The method of claim 21, wherein each of the identifying the plurality of contraction trees, the identifying the set of compute devices, the execution of the first subset of multiple tasks, and the execution of the second subset of multiple tasks is performed without notifying the requestor.

27. The method of claim 21, wherein the set of compute devices includes at least one local computing resource and at least one remote computing resource.

28. The method of claim 21, wherein the identifying the plurality of contraction trees is further based on a criterion that includes at least one of: maximizing an amount of shared work or minimizing a number of associated floating-point operations (FLOPs).

29. The method of claim 21, further comprising partitioning the plurality of tasks to produce the first subset of multiple tasks and the second subset of multiple tasks, wherein at least one of the assigning the first subset of multiple tasks to the first compute device or the assigning the second subset of multiple tasks to the second compute device is based on the partitioning.

*    *    *    *    *